US011409920B2

(12) United States Patent
Benjamin et al.

(10) Patent No.: US 11,409,920 B2
(45) Date of Patent: Aug. 9, 2022

(54) GENERATIVE DESIGN FOR ARCHITECTURE

(71) Applicant: AUTODESK, INC., San Rafael, CA (US)

(72) Inventors: David Benjamin, New York, NY (US); Danil Nagy, New York, NY (US)

(73) Assignee: AUTODESK, INC., San Rafael, CA (US)

( * ) Notice: Subject to any disclaimer, the term of this patent is extended or adjusted under 35 U.S.C. 154(b) by 524 days.

(21) Appl. No.: 15/812,885

(22) Filed: Nov. 14, 2017

(65) Prior Publication Data

US 2018/0137213 A1 May 17, 2018

Related U.S. Application Data

(60) Provisional application No. 62/421,942, filed on Nov. 14, 2016.

(51) Int. Cl.
*G06F 30/13* (2020.01)
*G06T 19/00* (2011.01)
*G06T 17/10* (2006.01)

(52) U.S. Cl.
CPC .............. *G06F 30/13* (2020.01); *G06T 17/10* (2013.01); *G06T 19/003* (2013.01)

(58) Field of Classification Search
CPC ........ G06F 30/13; G06T 17/10; G06T 19/003
See application file for complete search history.

(56) References Cited

U.S. PATENT DOCUMENTS

| 9,661,473 | B1* | 5/2017 | Jarvis | H04W 4/043 |
|---|---|---|---|---|
| 2003/0018492 | A1* | 1/2003 | Carlson | G06Q 10/06 703/1 |
| 2009/0043504 | A1* | 2/2009 | Bandyopadhyay | G01C 17/38 701/469 |
| 2014/0288890 | A1* | 9/2014 | Khainson | G06Q 50/22 703/1 |
| 2016/0048612 | A1* | 2/2016 | Simon | G06F 30/13 703/1 |
| 2018/0025099 | A1* | 1/2018 | van Gorp | G06F 30/00 356/138 |
| 2018/0067593 | A1* | 3/2018 | Tiwari | G08B 29/18 |
| 2018/0069932 | A1* | 3/2018 | Tiwari | G01S 5/0252 |

(Continued)

OTHER PUBLICATIONS

Bahrehmand, Arash. "A Computational model for generating and analysing architectural layouts in virtual environments." PhD diss., Universitat Pompeu Fabra, 2016. (Year: 2016).*

(Continued)

*Primary Examiner* — Chuen-Meei Gan
(74) *Attorney, Agent, or Firm* — Artegis Law Group, LLP

(57) ABSTRACT

A design engine includes a geometry module and a metric module that interoperate to generate optimal design options. The geometry module initially generates a spectrum of design options for a structure based on project constraints and design criteria set forth by potential occupants of the structure. The metric module then analyzes each design option and generates, for any given design option, a set of metrics that indicates how well the given design option meets the design criteria. The geometry module then generates additional design options in an evolutionary manner to improve the metrics generated for subsequent design options.

20 Claims, 21 Drawing Sheets

(56) References Cited

U.S. PATENT DOCUMENTS

| | | | | |
|---|---|---|---|---|
| 2018/0102858 A1* | 4/2018 | Tiwari | ............ | G06Q 10/04 |
| 2018/0149481 A1* | 5/2018 | Hirai | ............ | G06F 30/00 |
| 2018/0230692 A1* | 8/2018 | Thebaud | ............ | E04H 1/04 |
| 2018/0253511 A1* | 9/2018 | Benjamin | ............ | G06F 30/13 |
| 2018/0336289 A1* | 11/2018 | Benjamin | ............ | G06F 30/17 |
| 2019/0026402 A1* | 1/2019 | Benjamin | ............ | G06F 30/13 |
| 2019/0065633 A1* | 2/2019 | Stoddart | ............ | G06F 30/13 |
| 2019/0147120 A1* | 5/2019 | Benjamin | ............ | G06F 30/13 703/1 |

OTHER PUBLICATIONS

Yang, Liping, and Michael Worboys. "Generation of navigation graphs for indoor space." International Journal of Geographical Information Science 29, No. 10 (2015): 1737-1756. (Year: 2015).*
2015 International Building Code Chapter 3: Use and Occupancy Classification https://codes.iccsafe.org/content/IBC2015/chapter-3-use-and-occupancy-classification (Year: 2015).*
Turner, Eric, and Avideh Zakhor. "Floor plan generation and room labeling of indoor environments from laser range data." In 2014 international conference on computer graphics theory and applications (GRAPP), pp. 1-12. IEEE, 2014. (Year: 2014).*
Non-Final Office Action received for U.S. Appl. No. 15/812,889, dated Feb. 14, 2020, 48 pages.
Arash Bahrehmand, A Computational Model for Generating and Analysing Architectural Layouts in Virtual Environments Universitat Pompeu Fabra Sep. 16, 2019 (Year: 2016).
Bahrehmand, Arash, Thomas Batard, Ricardo Marques, Alun Evans, and Josep Blat. "Optimizing layout using spatial quality metrics and user preferences." Graphical Models 93 (2017): 25-38. (Year: 2017).
Final Office Action received for U.S. Appl. No. 15/812,889, dated Jul. 28, 2020, 58 pages.
Lee HY, Yang IT, Lin YC. Laying out the occupant flows in public buildings for operating efficiency. Building and Environment. May 1, 2012;51:231-42. (Year: 2012).
Final Office Action received for U.S. Appl. No. 15/812,889 dated Aug. 6, 2021, 49 pages.
Notice of Allowance received for U.S. Appl. No. 15/812,889 dated Dec. 13, 2021, 17 pages.
Michalek et al., "Architectural layout design optimization", DOI:10.1080=03052150210000337355, vol. 34, No. 5, Feb. 26, 2002, pp. 461-484.

* cited by examiner

GENERATIVE DESIGN FOR ARCHITECTURE

CROSS-REFERENCE TO RELATED APPLICATIONS

This application claims priority benefit of the U.S. Provisional Patent Application titled "Project Discover: Generative Design for Architecture," filed on Nov. 14, 2016 and having Ser. No. 62/421,942. The subject matter of this related application is hereby incorporated herein by reference.

BACKGROUND OF THE INVENTION

Field of the Invention

Embodiments of the present invention relate generally to computer-aided design and manufacturing and, more specifically, to generative design for architecture.

Description of the Related Art

The architectural design process typically involves multiple competing design objectives. For example, an architect may have to design a building that facilitates team communication while also providing sufficient individual privacy. When designing a building or other structure, architects and other designers traditionally manage the various competing design objectives and the trade-offs among the different design objectives qualitatively, relying on intuition and experience. However, this traditional approach suffers from at least the following drawbacks.

First, the traditional approach provides no way to identify deterministically the degree to which a given design meets a particular design objective. Consequently, an architect or designer may inadvertently create a design that does not adequately address all design objectives or fails to meet a particular design objective altogether.

Second, the traditional approach creates little, if any, hard data that can be analyzed by the external stakeholders in a given architectural project. Consequently, investors, owners, regulators, and other interested parties outside of the architectural design team have no way to analyze the suitability of a given design.

Accordingly, what is needed in the art are more effective techniques for generating and evaluating optimal architectural designs.

SUMMARY OF THE INVENTION

Various embodiments of the present invention set forth a computer-implemented method for generating a set of design options for a structure, including generating initial geometry for a first design option based on one or more design constraints, dividing the initial geometry along at least one axis to generate a set of divisions, subdividing the initial geometry based on the set of divisions to generate a plurality of subdivisions, modifying a first subdivision included in the plurality of subdivisions based on one or more construction parameters to generate a first neighborhood, wherein the one or more construction parameters indicate at least one of a shape, size, and position for the first neighborhood, generating a first set of fixtures associated with the structure, and populating the first neighborhood with the first set of fixtures to produce at least a portion of the first design option.

An advantage of the techniques set forth above is that the design options generated via the design engine specifically address the numerous competing design objectives typically associated with architectural design projects

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

As noted above, a conventional approach to architectural design often requires architects, engineers, and other types of designers to manage multiple competing design objectives intuitively and in a qualitative manner. With this qualitative approach, designers are not able to quantifiably determine whether all design objectives are met or determine the degree to which any given objective is met. Also, designers typically lack hard data that can be presented to various project stakeholders to validate different design options.

To address these issues, embodiments of the invention include a design engine that is configured to generate a spectrum of design options for a structure based on project constraints and also based on design criteria set forth by potential occupants of the structure. The design engine analyzes each design option and then generates, for any given design option, a set of metrics that indicates how well the given design option meets the multiple design criteria. The design engine may then generate additional spectrums of design options in an evolutionary manner to improve the metrics for any given design option. Advantageously, designers can generate a multitude of design options that addresses a range of design criteria in a quantifiable and metric-based manner.

Although the techniques set forth below are presented in the context of designing an office building, persons skilled in the art will understand that these techniques are applicable to the design of any space a group of individuals potentially co-occupy. For example, the foregoing techniques may be applied to design an airplane cabin, a baseball stadium, a convenience store, a house, a factory, and so forth. In some cases, such as the design of a factory, the requirements and preferences of people can be substituted with the requirements and preferences of equipment.

System Overview

Figure 1:
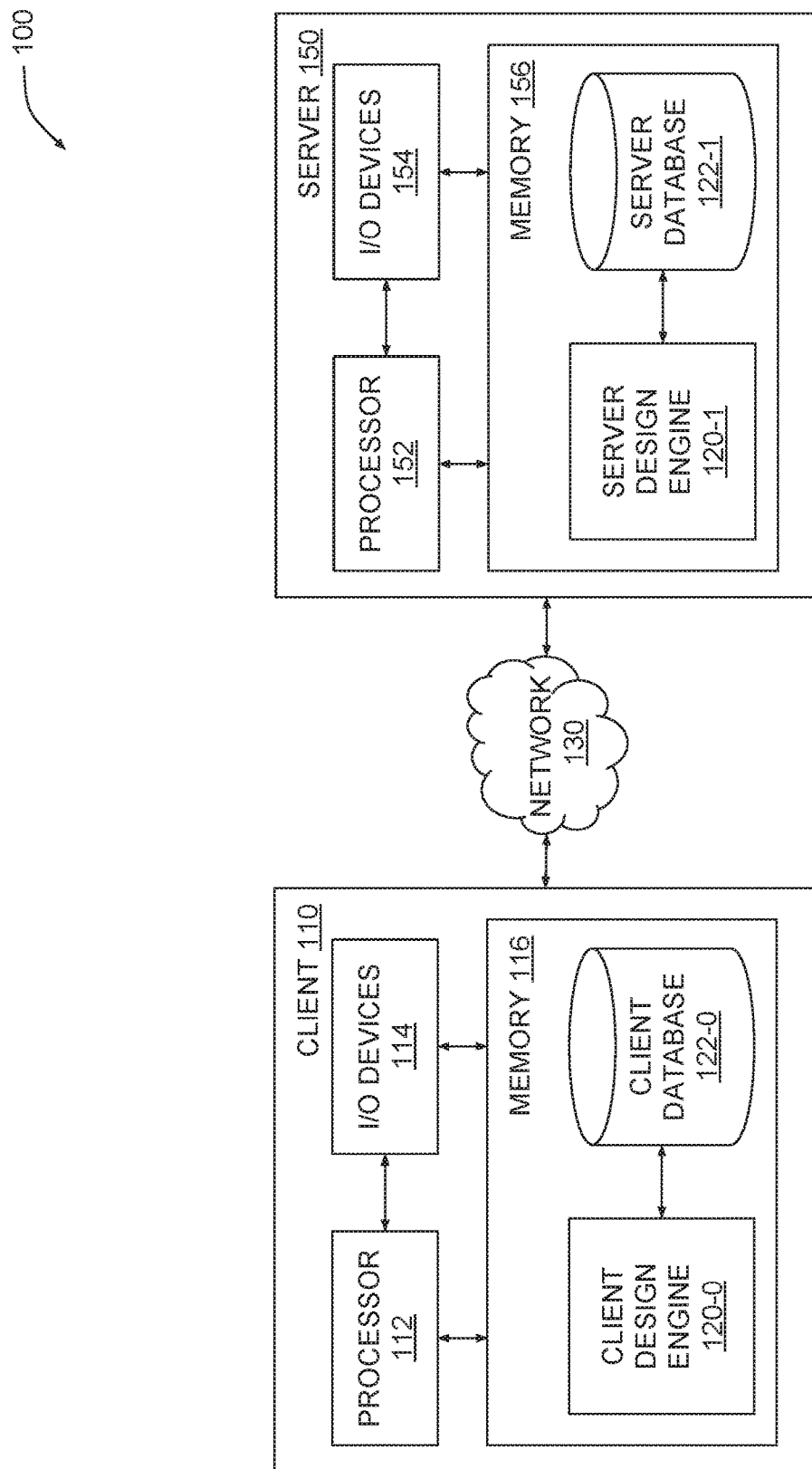
FIG. 1 illustrates a system configured to implement one or more aspects of the present invention.

FIG. 1 illustrates a system configured to perform one or more aspects of the present invention. As shown, system 100 includes a client 110 coupled via a network 130 to a server 150. Client 110 may be any technically feasible variety of client computing device, including a desktop computer, laptop computer, mobile device, and so forth. Network 150 may be any technically feasible set of interconnected communication links, including a local area network (LAN), wide area network (WAN), the World Wide Web, or the Internet, among others. Server 150 may be any technically feasible type of server computing device, including a remote virtualized instance of a computing device, one or more physical cloud-based computing devices, a mixture of the two, a portion of a datacenter, and so forth.

Client 110 includes processor 112, input/output (I/O) devices 114, and memory 116, coupled together. Processor 112 may be any technically feasible form of processing device configured process data and execute program code. Processor 112 could be, for example, a central processing unit (CPU), a graphics processing unit (GPU), an application-specific integrated circuit (ASIC), a field-programmable gate array (FPGA), and so forth. I/O devices 114 may include devices configured to receive input, including, for example, a keyboard, a mouse, and so forth. I/O devices 114 may also include devices configured to provide output, including, for example, a display device, a speaker, and so forth. I/O devices 114 may further include devices configured to both receive input and provide output, including, for example, a touchscreen, a universal serial bus (USB) port, and so forth.

Memory 116 may be any technically feasible storage medium configured to store data and software applications. Memory 116 could be, for example, a hard disk, a random access memory (RAM) module, a read-only memory (ROM), and so forth. Memory 116 includes client design engine 120-0 and client database 122-0. Client design engine 120-0 is a software application that, when executed by processor 112, causes processor 112 to participate in iteratively generating a spectrum of design options for an architectural design project. In doing so, client design engine 120-0 may access client database 122-0. Client design engine 122-0 may also interoperate with a corresponding design engine that resides within server 150 and access a database that also resides on server 150, as described in greater detail below.

As shown, server 150 includes processor 152, I/O devices 154, and memory 156, coupled together. Processor 152 may be any technically feasible form of processing device configured to process data and execute program code, including a CPU, a GPU, an ASIC, an FPGA, and so forth. I/O devices 114 may include devices configured to receive input, devices configured to provide output, and devices configured to both receive input and provide output.

Memory 156 may be any technically feasible storage medium configured to store data and software applications, including a hard disk, a RAM module, a ROM, and so forth. Memory 156 includes server design engine 120-1 and server database 122-1. Server design engine 120-1 is a software application that, when executed by processor 156, causes processor 152 to iteratively generate a spectrum of design options for an architectural design project. In doing so, server design engine 120-1 may access server database 122-1. Server design engine 122-1 may also interoperate with client design engine 120-0 and access client database 122-0.

In operation, client design engine 120-0 and server design engine 120-1 interoperate to implement any and all of the inventive functionality described herein. In doing so, either one or both of client design engine 120-0 and server design engine 120-1 may access either one or both of client database 122-0 and server database 122-1. Generally, client design engine 120-0 and server design engine 120-1 represent different portions of a single distributed software entity. Thus, for simplicity, client design engine 122-0 and server design engine 122-1 will be collectively referred to herein as design application 120. Similarly, client database 122-0 and server database 122-1 represent different portions of a single distributed storage entity. Therefore, for simplicity, client database 122-0 and server database 122-1 will be collectively referred to herein as database 122.

As described in greater detail below in conjunction with FIG. 2, design engine 120 is configured to collect design criteria and design constraints associated with an architectural design project, and then generate a spectrum of design options for a structure being designed. Design engine 120 then analyzes those design options to identify the degree to which each design option meets the various design criteria. The design engine implements an evolutionary approach to generate additional spectrums of design options based on how closely previous design options meet the design criteria.

Figure 2:
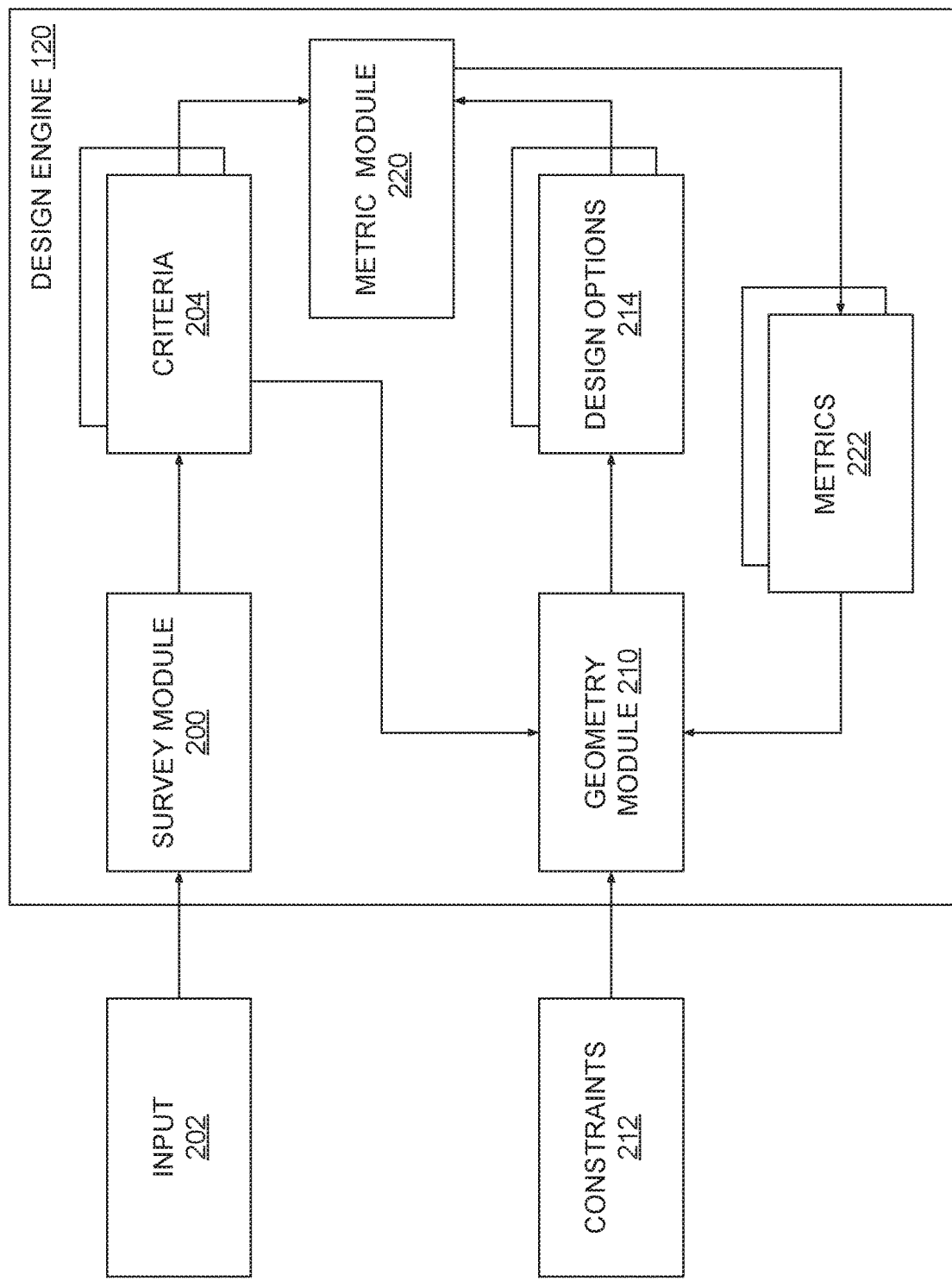
FIG. 2 is a more detailed illustration of the design engine of FIG. 1, according to various embodiments of the present invention.

FIG. 2 is a more detailed illustration of the design engine of FIG. 1, according to various embodiments of the present invention. As shown, design engine 120 includes a survey module 200, a geometry module 210, and a metric module 220. Survey module 200 is configured to conduct a survey to gather input 202 from potential occupants of the structure being designed. The survey conducted by survey module 200 includes inquiries concerning the working preferences of potential occupants. For example, the survey could request that a potential occupant select a desired noise level for a workstation to be assigned to the occupant. The survey could also request that the potential occupant select a desired proximity to different amenities, such as a kitchen or bathroom, or desired proximity to different co-occupants.

Survey module 200 may implement any technically feasible approach to conducting a survey. For example, survey module 200 could generate a web-based form that includes a set of survey questions, and then capture input 202 by processing the populated form. Survey module 200 generally includes in the survey multiple choice questions or other types of questions having discrete answers. Additionally, survey module 200 conducts the survey non-anonymously, meaning that a set of captured answers to the survey questions are associated with a particular potential occupant. Survey module 200 conducts the aforesaid survey across some or all potential occupants of the structure, and then generates criteria 204 to reflect the survey results. Criteria 204 includes all survey answers organized on a per-occupant basis, where each occupant may be associated with one or more workgroups or teams.

Geometry module 210 is configured to process criteria 204 and constraints 212 to generate a set of design options 214. Constraints 212 include various design limitations according to which the structure must be designed. For example, one constraint could indicate the physical boundaries within which the structure must reside. Each design option 214 is an architectural plan for a different version of the structure being designed. Any given design option 214 generally respects constraints 212 and also meets, to at least some degree, criteria 204. Geometry engine 210 generates each design option 214 via a generative design process that is described in greater detail below in conjunction with FIGS. 4-12.

Metric module 220 is configured to process criteria 204 and design options 214 to generate a set of metrics 222. Metrics 222 rate the degree to which each design option 214 meets criteria 204. Metric module 220 implements a discrete set of scoring algorithms to generate a range of different metrics for each different design option 214. Metric module 220 and the aforesaid scoring algorithms are discussed in greater detail below in conjunction with FIGS. 12-20B.

Geometry module 210 is configured to process metrics 222 to generate additional sets of design options 214. Metric module 220 then generates additional sets of metrics based on the additional sets of design options. This process may repeat iteratively across numerous cycles. Geometry module 210 generates design options 214 in a manner that may improve metrics 222 across many such cycles. For example, geometry module 210 could implement a genetic algorithm that recombines elements of successful design options 214 based on the particular metrics associated with those design options 214. In another example, geometry module 210 may implement a multi-objective solver to optimize design options 214 using metrics 222 as the objective functions. As a general matter, geometry module 210 produces design options 214 via a generative design process that is guided based on metrics 222. This overall process is described in stepwise fashion below in conjunction with FIG. 3.

Figure 3:
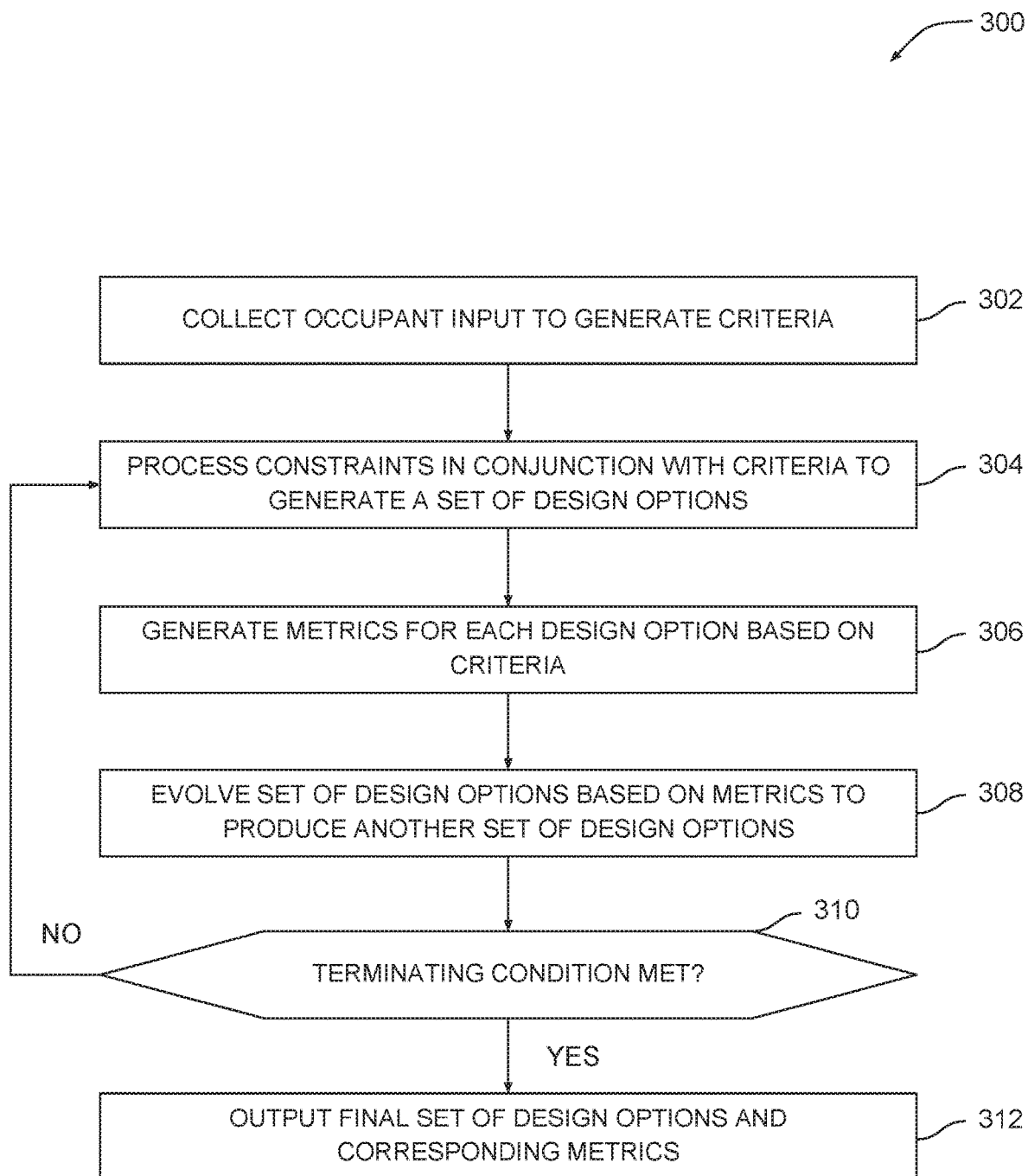
FIG. 3 is a flow diagram of method steps for generating a spectrum of different designs that optimize a set of design metrics, according to various embodiments of the present invention.

FIG. 3 is a flow diagram of method steps for generating a spectrum of different designs that optimize a set of design metrics, according to various embodiments of the present invention. Although the method steps are described in conjunction with the systems of FIGS. 1-2, persons skilled in the art will understand that any system configured to perform the method steps, in any order, is within the scope of the present invention.

As shown, a method 300 begins at step 302, where survey module 200 within design engine 120 collects input 202 from potential occupants of the structure being designed. Based on input 202, survey module 200 generates criteria 204 to reflect the working preferences of those potential occupants. At step 304, geometry module 210 processes constraints 212 in conjunction with criteria 204 to generate a set of design options 214. Each design option 214 represents an architectural design for the structure. At step 306, metric module 220 generates metrics 222 for each design option based on criteria 204. The particular metrics 222 generated for a given design option 214 reflect the degree to which that design option 214 meets criteria 204.

At step 308, geometry module 210 evolves the set of design options 214 based on metrics 222 to generate another set of design options 214. This additional set of design options 214 may better meet criteria 204. At step 310, design engine 120 determines whether a terminating condition has been met. In doing so, design engine 120 may implement a design evaluator (not shown) to determine whether the current set of design options 214 sufficiently meets criteria 204. If the terminating condition is not met, then the method 300 returns to step 304 and design iteration continues. Otherwise, the method proceeds to step 312, where design engine 120 outputs the final set of design options 214 and corresponding metrics 222.

Referring generally to FIGS. 1-3, according to the techniques described thus far, design engine 120 is capable of generating a spectrum of feasible design options that meets specific design constraints and design criteria in an objective, quantifiable manner. Accordingly, the designer of a structure can more effectively manage multiple competing design objectives. In addition, the designer is provided with objective data that can be presented to various stakeholders. This objective data may allow those stakeholders to analyze and discuss trade-offs between criteria and select a particular design option in an informed manner.

Generating a Spectrum of Different Design Options

Figure 4:
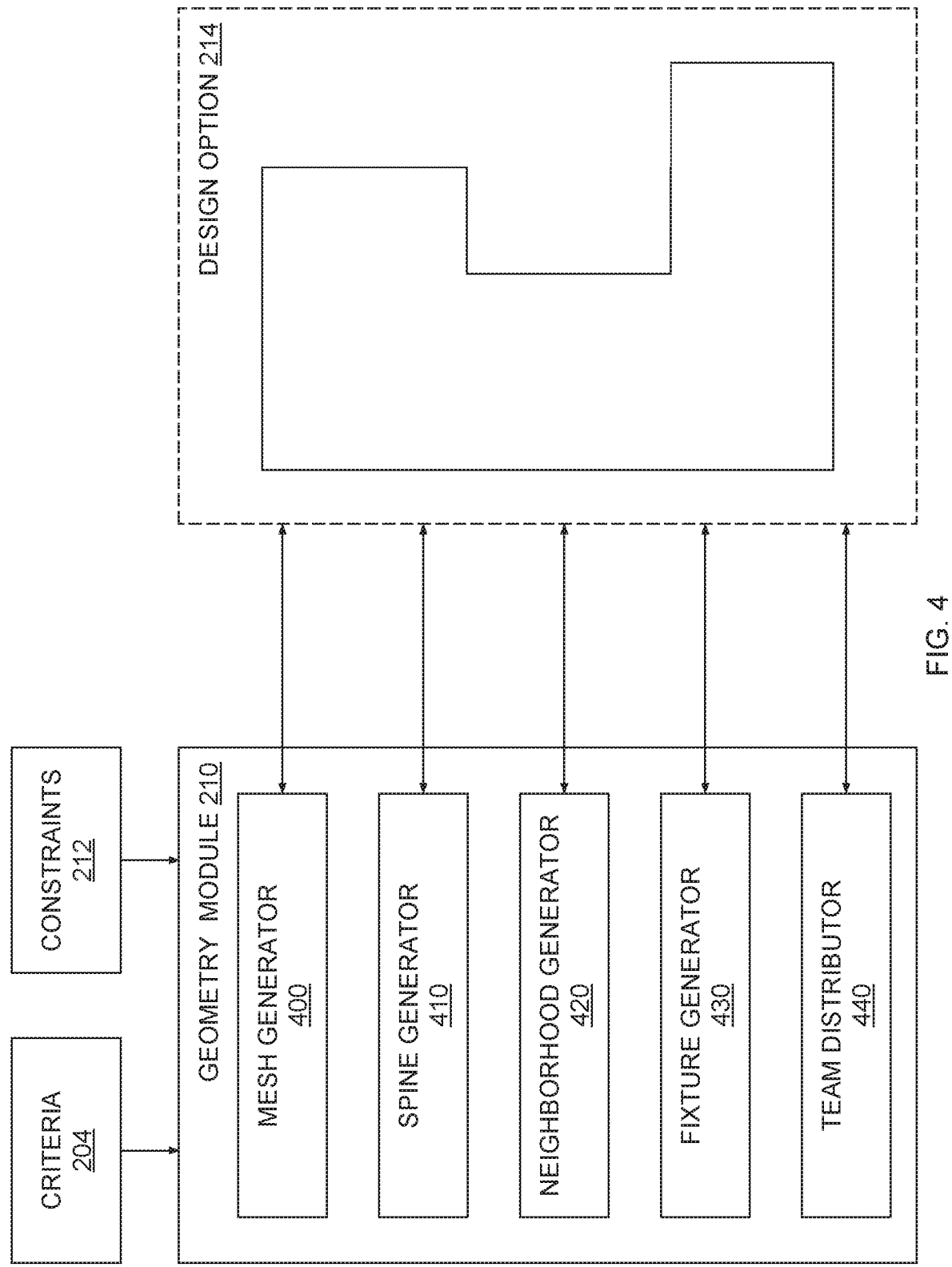
FIG. 4 is a more detailed illustration of the geometry module of FIG. 2, according to various embodiments of the present invention.

FIG. 4 is a more detailed illustration of the geometry module of FIG. 2, according to various embodiments of the present invention. As shown, geometry module 210 includes a mesh generator 400, a spine generator 410, a neighborhood generator 420, a fixture generator 430, and a team distributor 440. These various elements are configured to interoperate to generate a design option 214 based on criteria 204 and constraints 212. In doing so, each such element performs one or more geometrical construction steps to add or update the geometry of design option 214.

In particular, mesh generator 400 generates a geometrical mesh based on constraints 212, as described in greater detail below in conjunction with FIG. 5. Spine generator 410 constructs one or more spines to divide that mesh, as described in greater detail below in conjunction with FIG. 6. Neighborhood generator 420 creates neighborhoods by further subdividing the mesh, as described in greater detail below in conjunction with FIGS. 7-8. Fixture generator 430 populates the subdivided mesh with amenities, desks, and other workplace fixtures, as described in greater detail below in conjunction with FIGS. 9-10. Finally, team distributor 440 distributes teams of potential occupants to specific desks relative to particular amenities based on criteria 204, as described in greater detail below in conjunction with FIG. 11.

Figure 5:
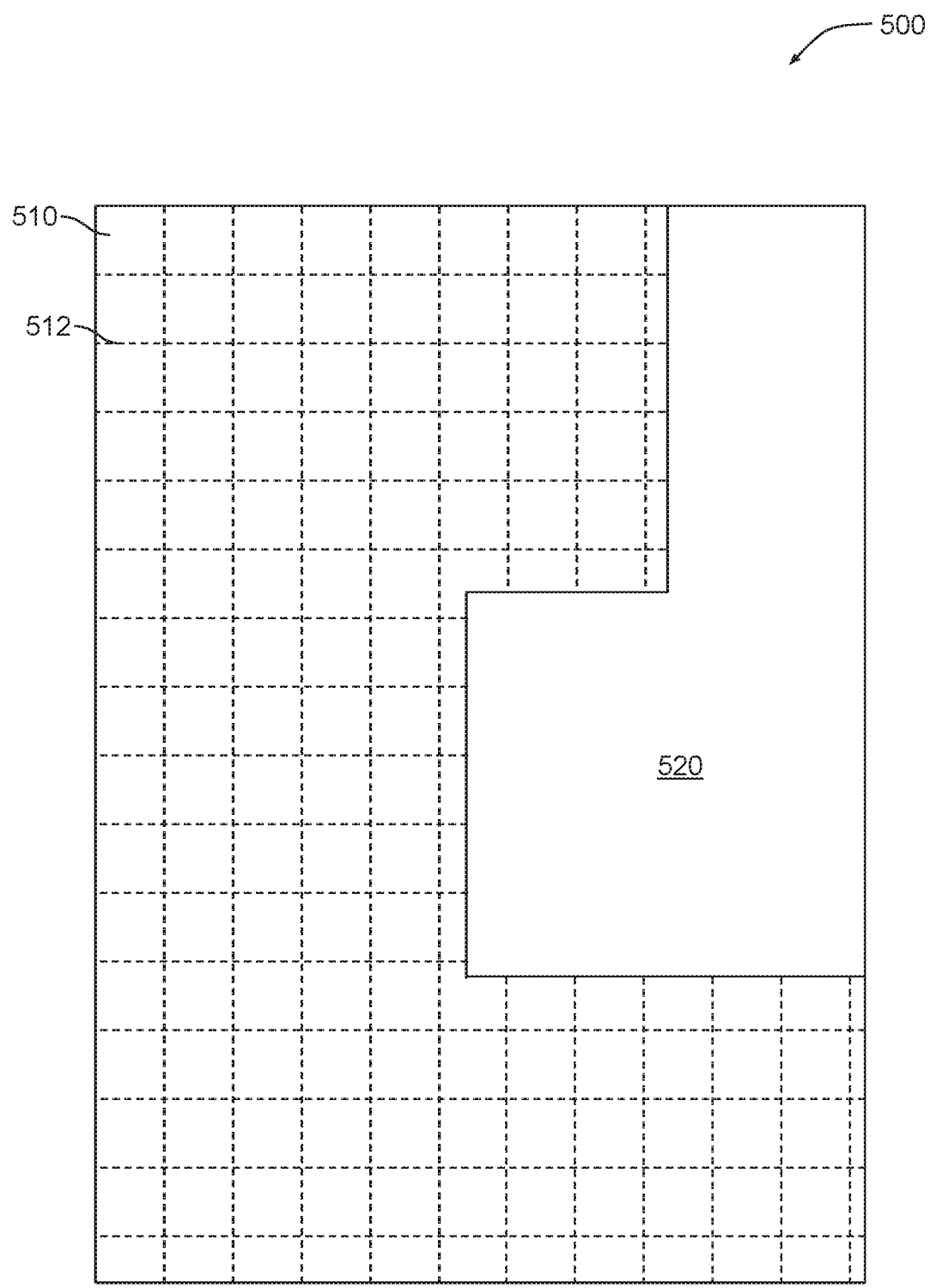
FIG. 5 illustrates how the mesh generator of FIG. 4 generates an initial geometrical mesh for a given design option, according to various embodiments of the present invention.

FIG. 5 illustrates how the mesh generator of FIG. 4 generates an initial geometrical mesh for a given design option, according to various embodiments of the present invention. As shown, an initial layout 500 includes a design area 510 and an open area 520. Initial layout 500 may be described within constraints 212 and could represent, for example, a property boundary, among other types of boundaries. Design area 510 defines a region within initial layout 500 where the structure being designed is meant to reside, while open area 520 defines an area that is separate from that structure, such as a parking lot or courtyard. The boundaries of design area 510 and open area 520 may also be defined in constraints 212. Mesh generator 400 is configured to process initial layout 500, design area 510 and open area 520 and then generate a mesh 512. Mesh 512 defines a coordinate system according to which additional geometrical constructions can be defined. Mesh 512 may be a two-dimensional grid (2D) representing a single floor of a structure, a stack of 2D grids representing multiple floors of a multi-story structure, or a 3D grid representing a volume of space associated with the structure.

Figure 6:
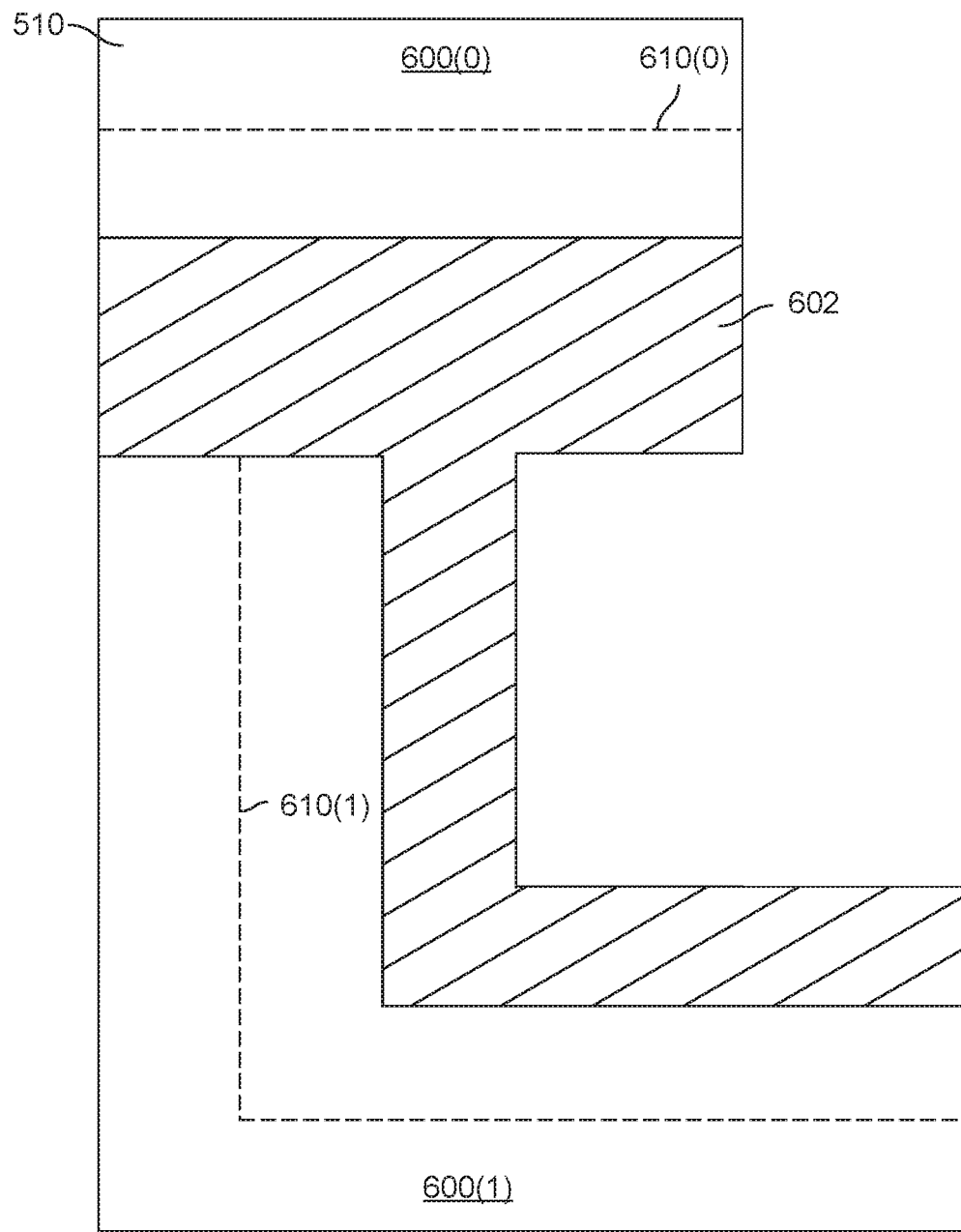
FIG. 6 illustrates how the spine generator of FIG. 4 divides a design area into different regions, according to various embodiments of the present invention.

FIG. 6 illustrates how the spine generator of FIG. 4 divides a design area into different regions, according to various embodiments of the present invention. As shown, design area 510 includes generative regions 600(0) and 600(1) and non-generative region 602. Generative regions 600 represent portions of design area 510 where geometry module 210 generates and modifies geometry during a generative design process. Non-generative region 602 represents a portion of design area 510 that must remain fixed over successive generative design iterations. Non-generative region 602 could be, for example, a stairwell or elevator shaft that cannot be placed anywhere else within design area 510. Generative regions 600 and non-generative region 602 may be specified in constraints 212. Spine generator 410 is configured to subdivide each generative region 600 along an approximate centerline by constructing a spine 610. Each spine 610 divides the corresponding generative region 600 in a lengthwise manner, as is shown.

Figure 7:
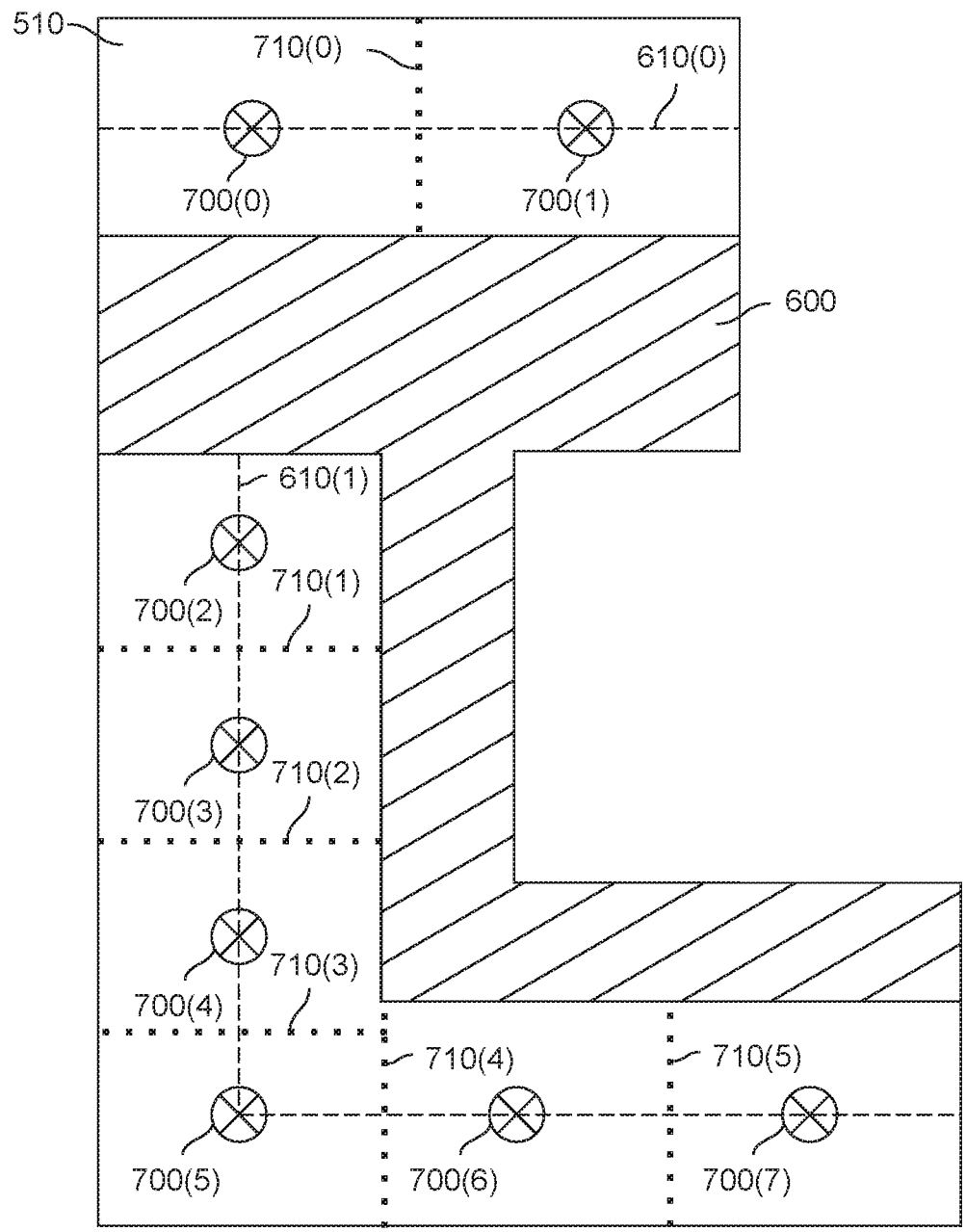
FIG. 7 illustrates how the neighborhood generator of FIG. 4 subdivides different regions, according to various embodiments of the present invention.

FIG. 7 illustrates how the neighborhood generator of FIG. 4 subdivides different regions, according to various embodiments of the present invention. As shown, each spine 610 includes a set of neighborhood seed points 700 spaced at regular or irregular intervals. Neighborhood generator 420 generates neighborhood seed points 700 according to one or more distribution parameters that may vary during generative design and, accordingly, may vary across design options 214. Those distribution parameters may indicate the number and proximity of neighborhood seed points 700. Once neighborhood seed points 700 are placed, neighborhood generator 420 constructs intermediate neighborhood boundaries 710 that separate each neighborhood seed point 700 from one or more adjacent neighborhood seed points 700.

Figure 8:
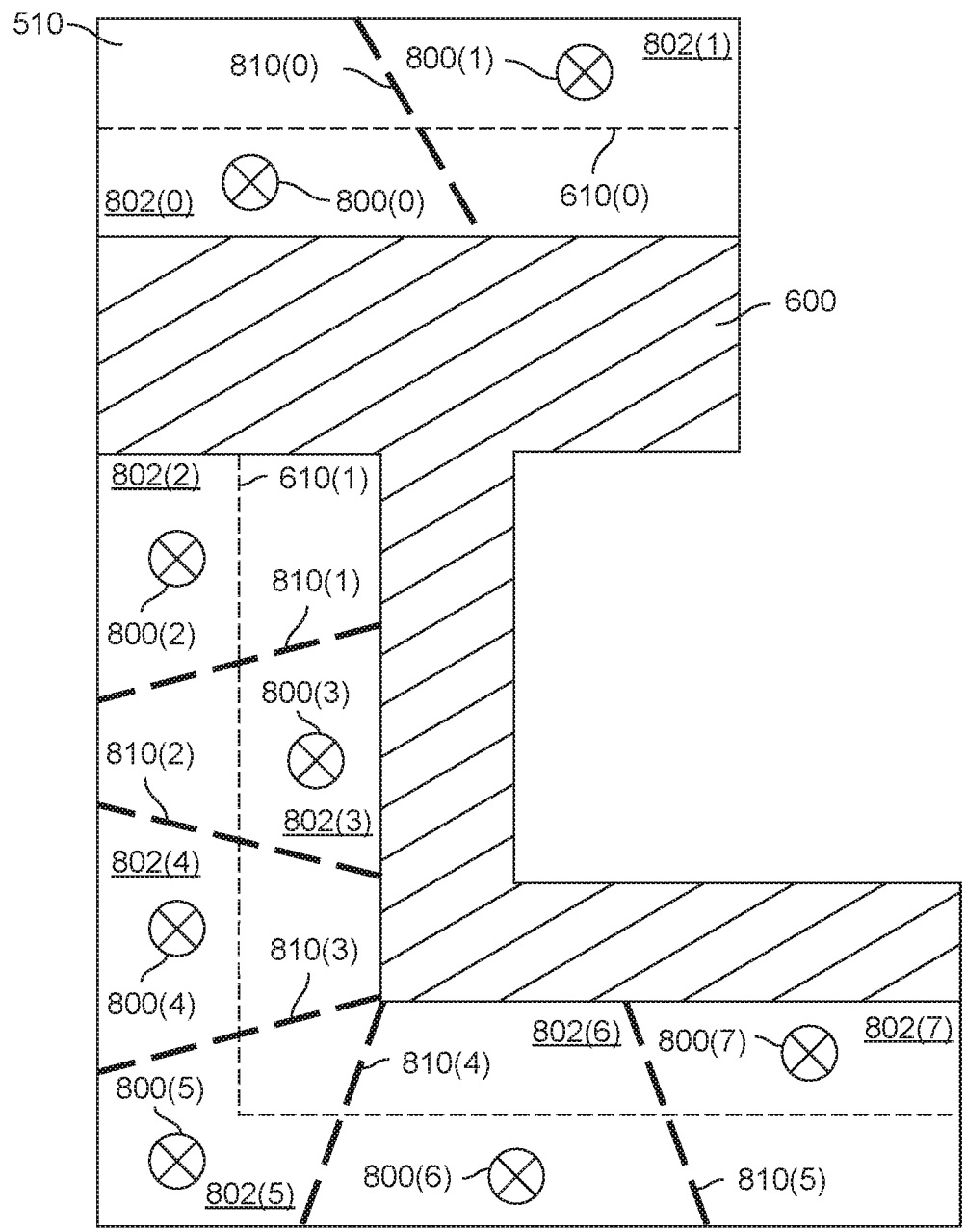
FIG. 8 illustrates how the neighborhood generator of FIG. 4 generates neighborhoods from different subdivisions, according to various embodiments of the present invention.

FIG. 8 illustrates how the neighborhood generator of FIG. 4 generates neighborhoods from different subdivisions, according to various embodiments of the present invention. As shown, neighborhood generator 420 shifts each neighborhood seed point 700 to generate a neighborhood center 800. Each neighborhood center 800 corresponds to a different neighborhood 802. A given neighborhood 802 is a communal workspace that can be occupied by a team or workgroup of potential occupants.

The direction and magnitude with which each neighborhood seed point 700 shifts may vary during generative design and, accordingly, may vary across design options 214. Neighborhood generator 420 also shifts intermediate neighborhood boundaries 710 relative to neighborhood centers 800 to produce neighborhood boundaries 810. The shifting of intermediate neighborhood boundaries 710 may also vary during generative design across design options 214. As a general matter, any of the neighborhood construction parameters discussed herein may vary during generative design and, thus, may vary between design options 214. In addition, any of those construction parameters may vary between floors of a given design option 214.

Figure 9:
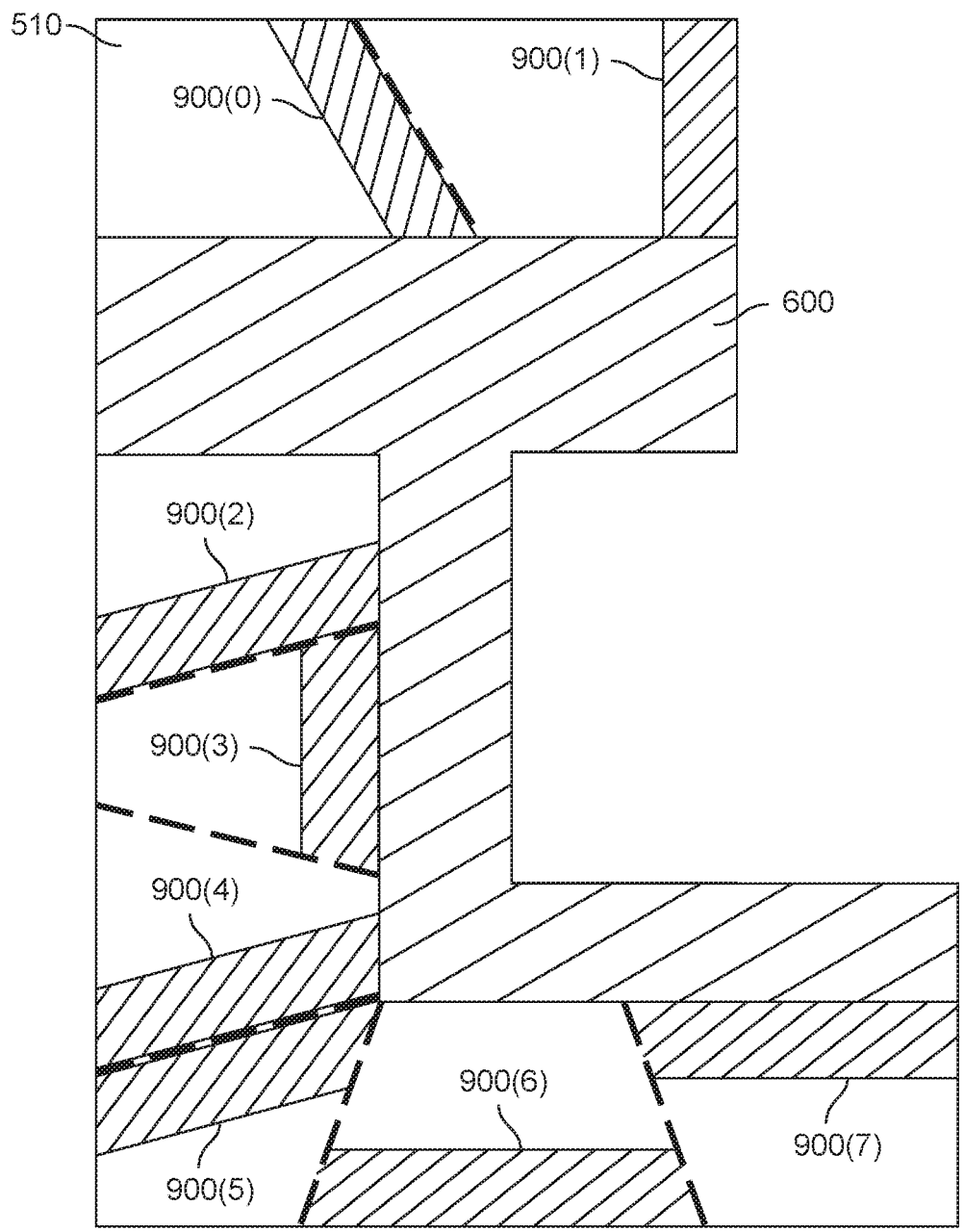
FIG. 9 illustrates how the fixture generator of FIG. 4 generates amenity zones within different neighborhoods, according to various embodiments of the present invention.

FIG. 9 illustrates how the fixture generator of FIG. 4 generates amenity zones within different neighborhoods, according to various embodiments of the present invention. As shown, fixture generator 430 identifies an edge of each neighborhood 802 and then designates an adjacent zone 900 for an amenity cluster. An amenity cluster may include a variety of different types of fixtures. In the context of a workplace, those fixtures may include a kitchen, a lounge, a coffee bar, a bathroom, a private office, a conference room, a workstation, and so forth. In other design contexts, fixtures may include factory equipment, stadium seating, serving stations, self-checkout machines, and so forth.

Figure 10:
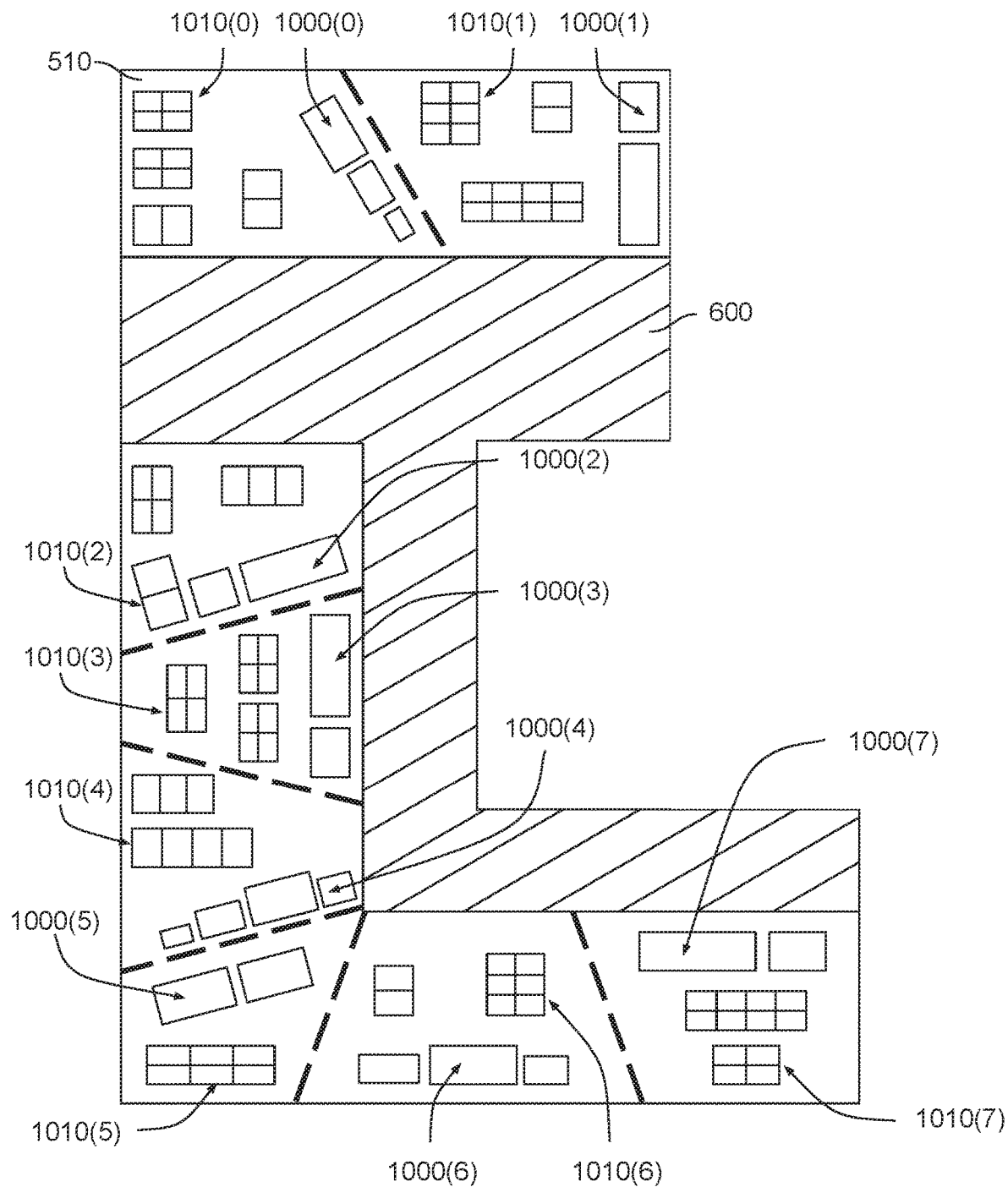
FIG. 10 illustrates how the fixture generator of FIG. 4 populates different neighborhoods with fixtures, according to various embodiments of the present invention.

FIG. 10 illustrates how the fixture generator of FIG. 4 populates different neighborhoods with fixtures, according to various embodiments of the present invention. As shown, fixture generator 430 populates zones 900 with specific amenity clusters 1000 and also places groups of desks 1010 adjacent to those clusters. Fixture generator 430 may also place other types of fixtures, although none others are shown here. For example, as mentioned above, fixture generator 430 could populate the various neighborhoods 802 with factory equipment when the structure being designed is a factory. Fixture generator 430 may distribute fixtures according to a variety of different techniques, although generally fixture generator 430 allocates an appropriate, and possibly predefined, amount of space to each fixture. Once those fixtures are distributed, the geometry of design option 214 is complete.

Figure 11:
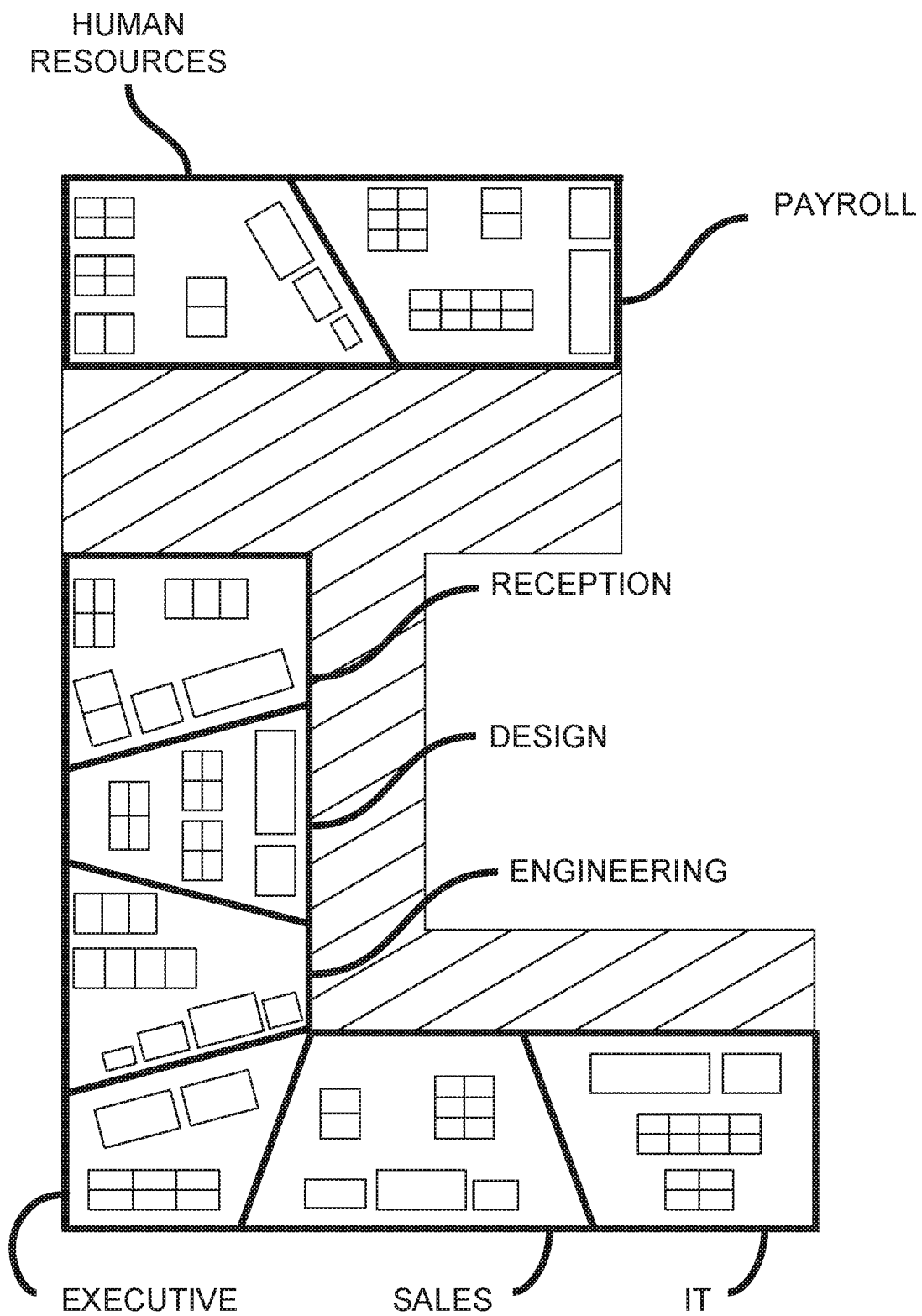
FIG. 11 illustrates how the team distributor of FIG. 4 distributes teams within a given design option, according to various embodiments of the present invention.

FIG. 11 illustrates how the team distributor of FIG. 4 distributes teams within a given design option, according to various embodiments of the present invention. As discussed above in conjunction with FIG. 2, criteria 204 reflects the working preferences of each potential occupant. Those working preferences may include desired distances to various amenities, centrality within the overarching workspace, exposure to traffic or other distractions, and so forth. Criteria 204 also indicates team membership for each potential occupant, as mentioned. In the context of this disclosure, a "team" simply refers to a group of potential occupants who should be assigned to the same neighborhood. In the context of a typical office, a team could refer to a department, such as "accounting" or "engineering," as shown in FIG. 11, for example.

Team distributor 440 is configured to analyze the geometry of design option 214 and then distribute different teams of potential occupants across each neighborhood 802 in a manner that optimally addresses the specific working preferences of each occupant. Team distributor 440 may also assign potential occupants to specific neighborhoods 802 based on overall team preferences aggregated across team members. Team distributor 440 may implement a "best fit" algorithm in order to generate a team distribution that matches teams to neighborhoods 802. Team distributor 440 may determine the degree to which any particular criteria 204 is met based on the set of metrics 222 computed by metric module 220. As discussed, metric module 220 includes a set of scoring algorithms according to which metrics 222 can be generated based on a particular design option 214 and a specific set of criteria 204. Metric module, and the various scoring algorithms, are described in greater detail below in conjunction with FIGS. 13-20B.

Figure 12:
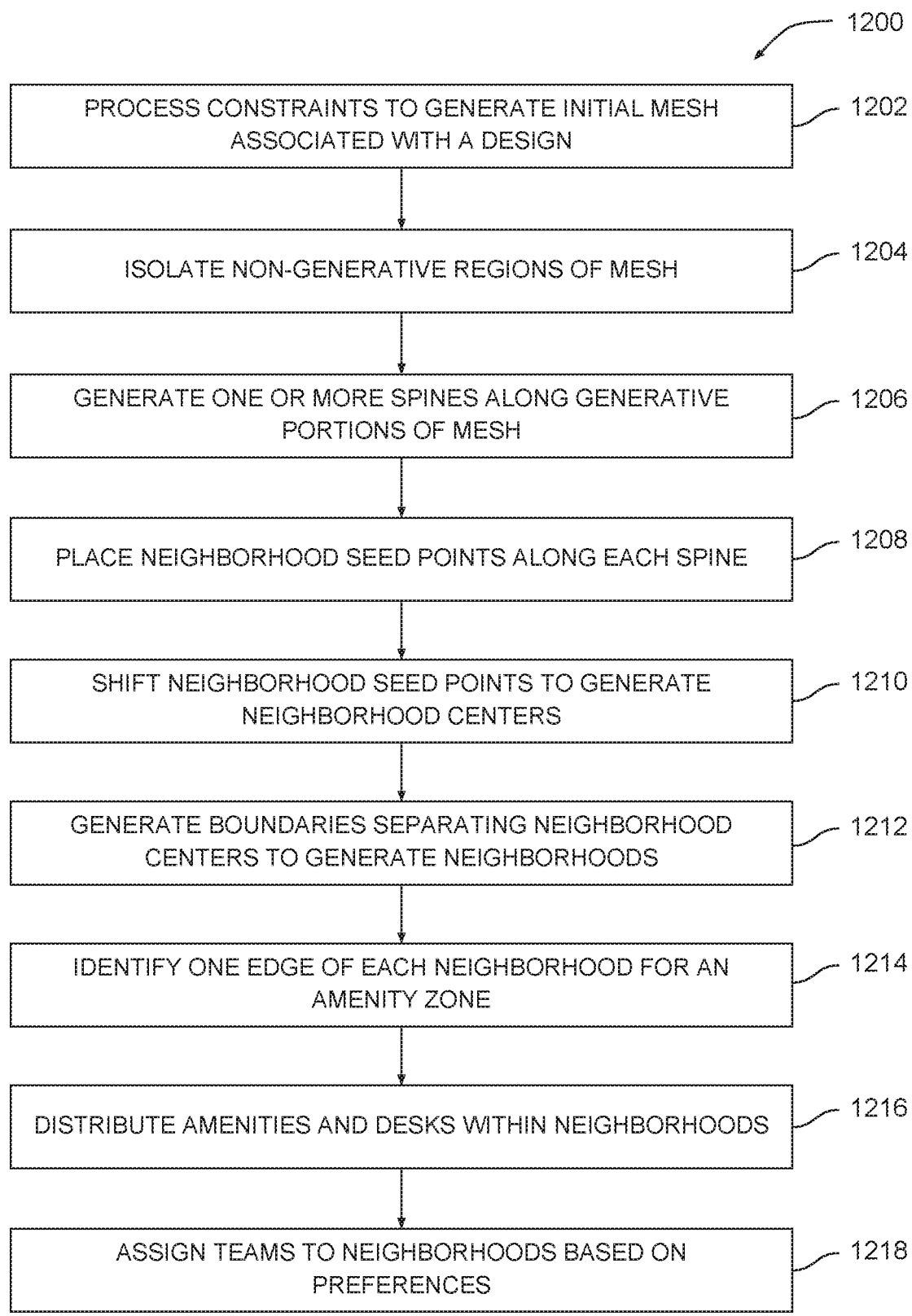
FIG. 12 is a flow diagram of method steps for generating geometry associated with a given design option, according to various embodiments of the present invention.

FIG. 12 is a flow diagram of method steps for generating geometry associated with a given design option, according to various embodiments of the present invention. Although the method steps are described in conjunction with the systems of FIGS. 1-2 and 4-11, persons skilled in the art will understand that any system configured to perform the method steps, in any order, is within the scope of the present invention.

As shown, a method 1200 begins at step 1202, where mesh generator 400 within geometry module 210 process constraints 212 to generate an initial mesh 512 associated with a design option 214. Mesh 512 defines a coordinate system according to which various elements of a design option 214 can be placed. At step 1204, spine generator 410 isolates non-generative regions 602 of mesh 512. The non-generative regions 602 include areas of the mesh where generative design should not be applied. At step 1206, spine generator 410 generates one or more spines 610 along generative portions of mesh. Each spine 610 divides a portion of the remaining generative regions 600 of mesh 512.

At step 1208, neighborhood generator 420 places neighborhood seed points 700 along each spine 610. Then, at step 1210, neighborhood generator 420 shifts those neighborhood seed points 700 to generate neighborhood centers 800. At step 1212, neighborhood generator 420 generates boundaries 810 separating neighborhood centers 800 to generate neighborhoods 802. A team of potential occupants can potentially occupy each neighborhood 802. At step 1214, fixture generator 430 identifies one edge of each neighborhood 802 to place a zone 900 for amenities. At step 1216, fixture generator 430 distributes amenities 1000 and desks 1010 within neighborhoods 802. Finally, at step 1218, team distributor 440 assigns teams to neighborhoods 802 based on working preferences set forth in criteria 204.

Once geometry module 210 generates the set of design options 214 via the approach discussed thus far, metric module 220 may then generate metrics 222 for each such design option 214 based on criteria 204. As described in greater detail below in conjunction with FIGS. 13-20B, the various metrics 222 are generated based on individual criteria 204 collected from each potential occupant surveyed. Accordingly, metrics 222 may objectively and quantifiably indicate the degree to which each design option 214 meets criteria 204.

Generating Metrics for a Spectrum of Different Design Options

Figure 13:
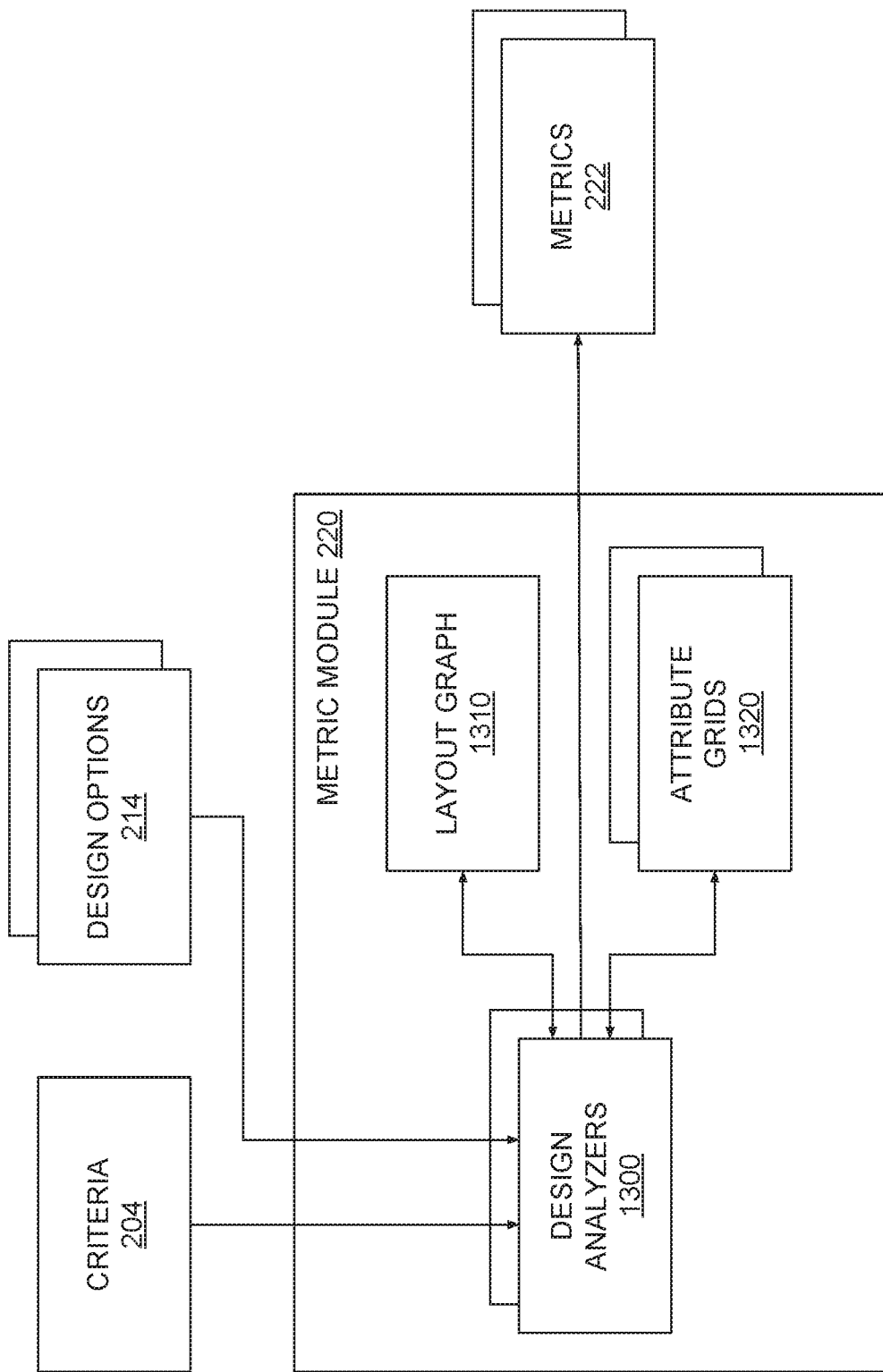
FIG. 13 is a more detailed illustration of the metric module of FIG. 2, according to various embodiments of the present invention.

FIG. 13 is a more detailed illustration of the metric module of FIG. 2, according to various embodiments of the present invention. As shown, metric module 220 includes design analyzers 1300, a layout graph 1310, and attribute grids 1320. In operation, design analyzers 1300 process criteria 204 and design options 214 to generate layout graph 1310 and attribute grids 1320. Layout graph 1310 and attribute grids 1320 are intermediate data structures used by design analyzers 1300 to compute metrics 222. Design analyzers 1300 includes seven distinct analyzers configured to generate five different attributes grids and six different metrics for each design option 214, as described in greater detail below in conjunction with FIG. 14.

Figure 14:
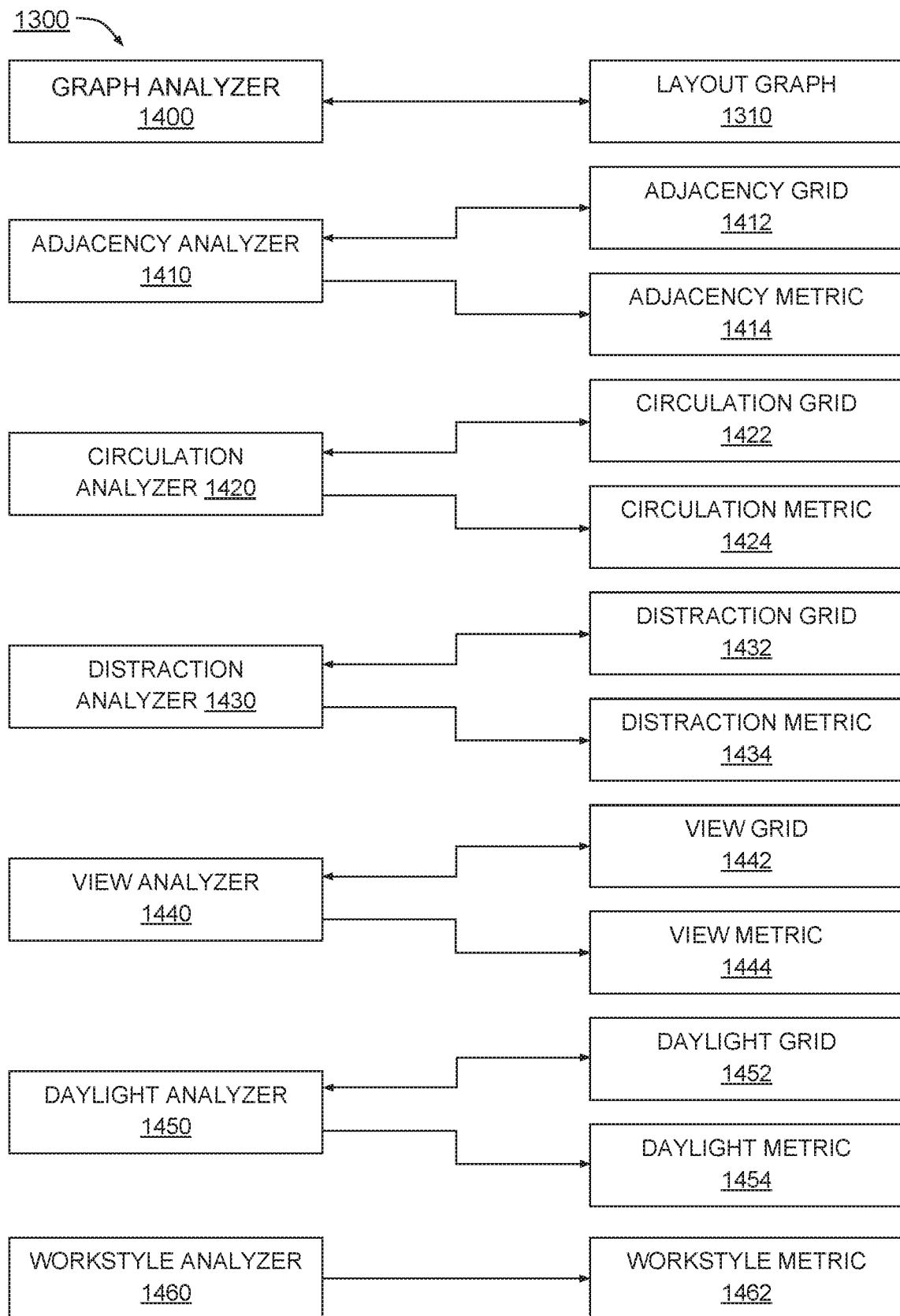
FIG. 14 is a more detailed illustration of the design analyzers of FIG. 13, according to various embodiments of the present invention.

FIG. 14 is a more detailed illustration of the design analyzers of FIG. 13, according to various embodiments of the present invention. As shown, design analyzers 1300 includes a graph analyzer 1400, an adjacency analyzer 1410, a circulation analyzer 1420, a distraction analyzer 1430, a view analyzer 1440, a daylight analyzer 1450, and a workstyle analyzer 1460.

Graph analyzer 1400 is configured to analyze a design option 214 and then generate layout graph 1300. Layout graph 1300 is a mathematical graph of nodes and edges. Each node of the graph represents a location where a potential occupant may be stationary for some amount of time. For example, a given node could be the desk of a potential occupant. Each edge of the graph represents a path a potential occupant may traverse. For example, a given edge could represent a path from a stairwell to conference room. Layout graph 1300 provides a foundation for the various attribute grids discussed in greater detail below.

Adjacency analyzer 1410 is configured to analyze the design option 214 in conjunction with layout graph 1300 and criteria 204 to generate an adjacency grid 1412. Adjacency grid 1412 is included in attribute grids 1320 of FIG. 13. Adjacency grid 1412 includes, for any given potential occupant, a set of paths between a desk assigned to that potential occupant and any specific amenities selected by that occupant via the above-discussed survey and indicated within criteria 204. Based on adjacency grid 1412 and criteria 204, adjacency analyzer 1410 generates adjacency metric 1414, as described in greater detail below in conjunction with FIG. 15.

Circulation analyzer 1420 is configured to analyze the design option 214 in conjunction with adjacency grid 1412 to generate a circulation grid 1422. Circulation grid 1422 is included in attribute grids 1320 of FIG. 13. Circulation grid 1422 indicates the general flow of traffic within design area 510 based on crossings of the paths included in adjacency grid 1412. Based on circulation grid 1422 and criteria 204, circulation analyzer 1420 generates circulation metric 1424, as described in greater detail below in conjunction with FIG. 16.

Distraction analyzer 1430 is configured to analyze the design option 214 in conjunction with circulation grid 1422 to generate a distraction grid 1432. Distraction grid 1432 is included in attribute grids 1320 of FIG. 13. Distraction grid 1432 indicates the number of distractions viewable from each desk included in design option 214. Those distractions may include other desks or areas with elevated circulation.

Based on distraction grid 1432 and criteria 204, distraction analyzer 1430 generates distraction metric 1434, as described in greater detail below in conjunction with FIG. 17.

View analyzer 1440 is configured to analyze the design option 214 to generate a view grid 1442. View grid 1442 is included in attribute grids 1320 of FIG. 13. View grid 1442 indicates the number of view to the outside from each desk within design option 214. Based on view grid 1442 and criteria 204, view analyzer 1440 generates view metric 1444, as described in greater detail below in conjunction with FIG. 18.

Daylight analyzer 1450 is configured to analyze the design option 214 in conjunction with layout graph 1300 to generate a daylight grid 1452. Daylight grid 1452 is included in attribute grids 1320 of FIG. 13. Daylight grid 1452 indicates the amount of light flowing through design option 214 over time. Based on daylight grid 1452 and criteria 204, daylight analyzer 1450 generates daylight metric 1450, as described in greater detail below in conjunction with FIG. 19.

Workstyle analyzer 1460 is configured to analyze the design option 214 in conjunction with circulation grid 1422 and daylight grid 1452 to generate workstyle metric 1462, as also described in greater detail below in conjunction with FIG. 19.

Each of the metrics discussed above can be computed by the corresponding analyzer by evaluating a specific algorithmic expression with various attributes of a given design option 214 as inputs. Those different algorithmic expressions are discussed below in conjunction with FIGS. 14-19, along with specific examples of the different attribute grids described above.

Figure 15:
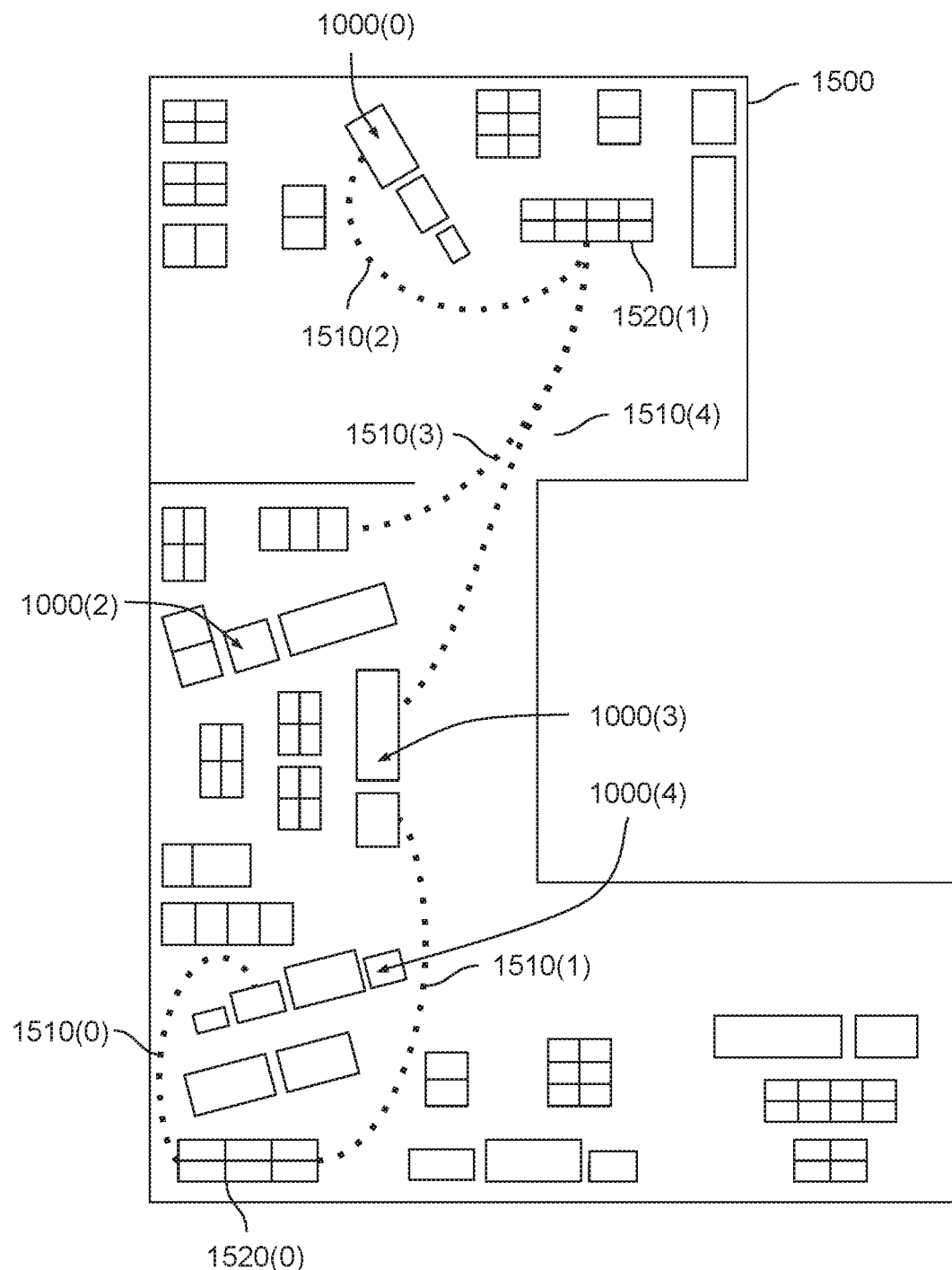
FIG. 15 is a more detailed illustration of the adjacency grid of FIG. 14, according to various embodiments of the present invention.

FIG. 15 is a more detailed illustration of the adjacency grid of FIG. 14, according to various embodiments of the present invention. As shown, exemplary adjacency grid 1500 includes a set of paths 1510 that traverse design area 510 within design option 214. Each path 1510 originates from an assigned desk 1520 and terminates at an amenity cluster 1000 or another assigned desk 1510. Adjacency analyzer 1410 constructs a different set of paths 1510 for each potential occupant assigned to a desk based on criteria 204. For example, adjacency analyzer 1410 constructs paths 1510(0) and 1510(1) coupling assigned desk 1520(0) to amenity clusters 1000(4) and 1000(3), respectively, because the potential occupant assigned to those desks indicated a preferential proximity to amenity clusters 1000(4) and 1000(3).

Adjacency analyzer 1410 constructs paths 1510 and then computes a separate adjacency metric 1414 for each potential occupant based on the distances of those paths. The adjacency metric 1414 for any given potential occupant generally represents the distance the potential occupant must travel, on average, to reach any desired destination.

Figure 16:
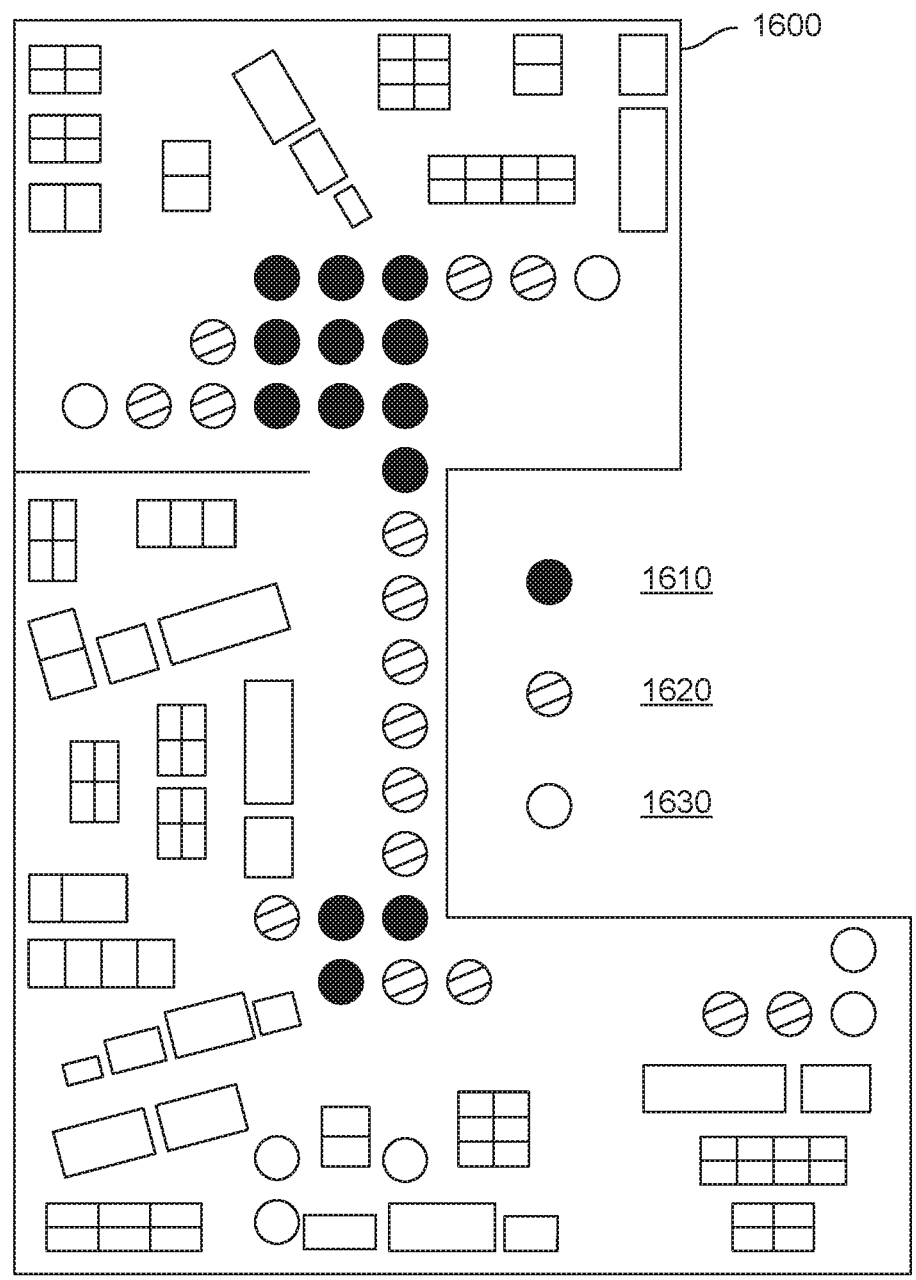
FIG. 16 is a more detailed illustration of the circulation grid of FIG. 14, according to various embodiments of the present invention.

FIG. 16 is a more detailed illustration of the circulation grid of FIG. 14, according to various embodiments of the present invention. As shown, exemplary circulation grid 1600 includes high circulation nodes 1610, medium circulation nodes 1620, and low circulation nodes 1630. Circulation analyzer 1420 generates and distributes these different circulation nodes across design area 510 of design option 214 based on the number of intersecting paths found in adjacency grid 1500 at each grid location of grid 512. For example, high circulation nodes 1610 are generally located in central areas where many paths 1510 intersect one another. Medium circulation nodes 1620 are generally located in sub-central areas where some paths 1510 intersect, and low circulation nodes 1630 are located in off-center areas where paths 1510 are not likely to intersect. Circulation grid 1600 thus indicates an estimate of the amount of traffic across design area 510 at any given time, defined for each grid location.

Circulation analyzer 1420 constructs circulation grid 1600 and then generates circulation score 1424 for each floor of design option 214 and/or for all floors in design option 214. The circulation score 1424 for a given floor is computed by comparing the different paths 1510 across design area 510, as defined in adjacency grid 1500, to the number and type of the different circulation nodes traversed by those paths. For example, a particular path 1510 through a high circulation node 1630 would contribute to a higher circulation score, whereas another path 1510 through a low circulation node 1630 might contribute to a lower circulation score.

Figure 17:
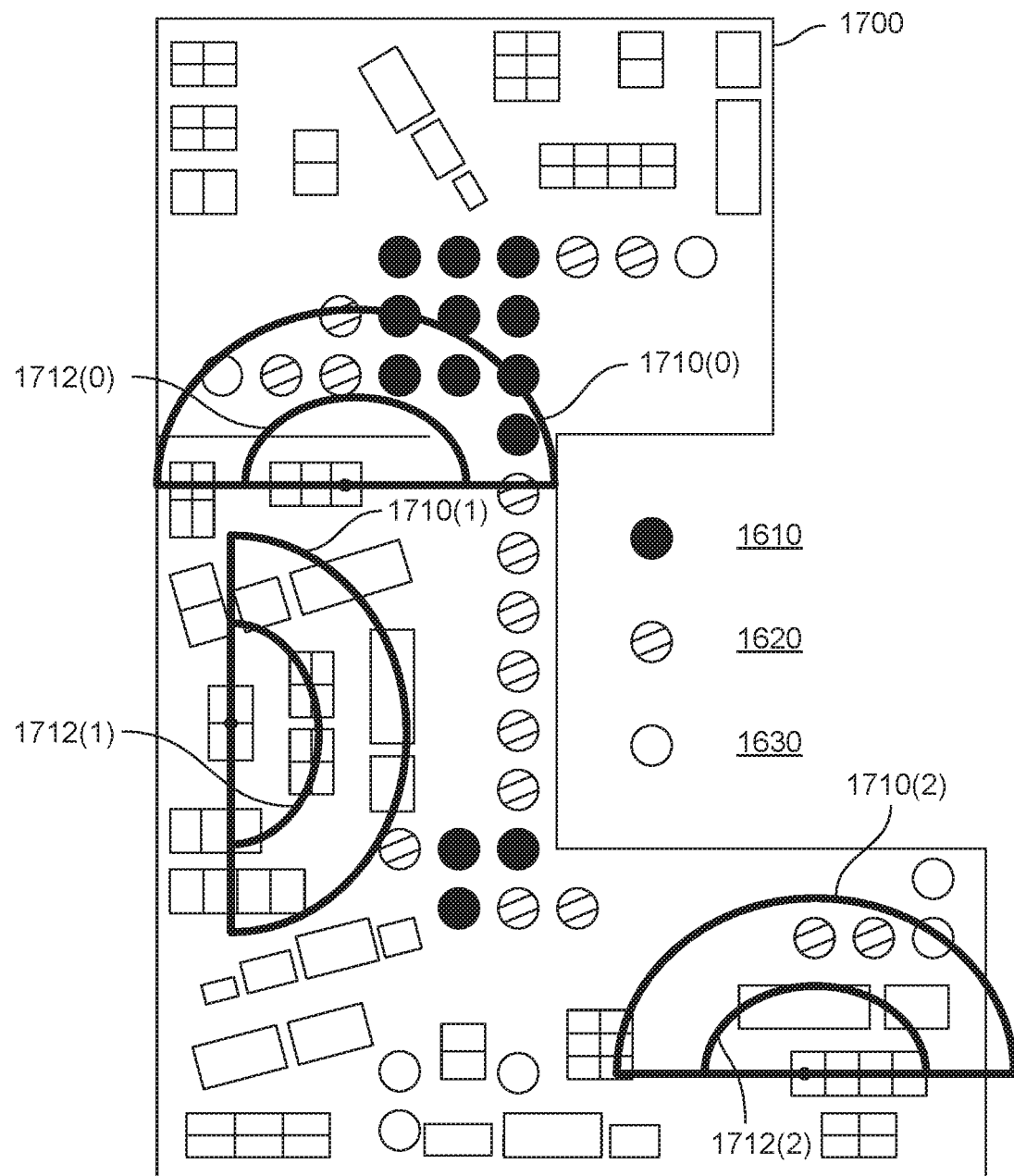
FIG. 17 is a more detailed illustration of the distraction grid of FIG. 14, according to various embodiments of the present invention.

FIG. 17 is a more detailed illustration of the distraction grid of FIG. 14, according to various embodiments of the present invention. As shown, an exemplary distraction grid 1700 includes long range and short range visual zones 1710 and 1712, respectively. Each long range visual zone 1710 is associated with a specific short range visual zone 1712, thereby forming a set of visual zones. Distraction analyzer 1430 generates a different set of visual zones for each assigned desk in design option 214. Distraction analyzer 1430 then computes a separate distraction metric 1434 for the corresponding assigned desk by determining the number of other desks and the number of high circulation nodes included in each of the long range and short range visual zones. These desks and high circulation nodes are considered "distractions." Distraction analyzer 1430 may weight the count of each distraction based on the particular visual zone where the distraction is found. Distraction metric 1434 thus indicates the distraction level associated with a particular desk. This metric can be aggregated over design option 214 as a whole to provide an overall distraction level for that design option, and then averaged over the number of desks to provide an average per-desk distraction level.

Figure 18:
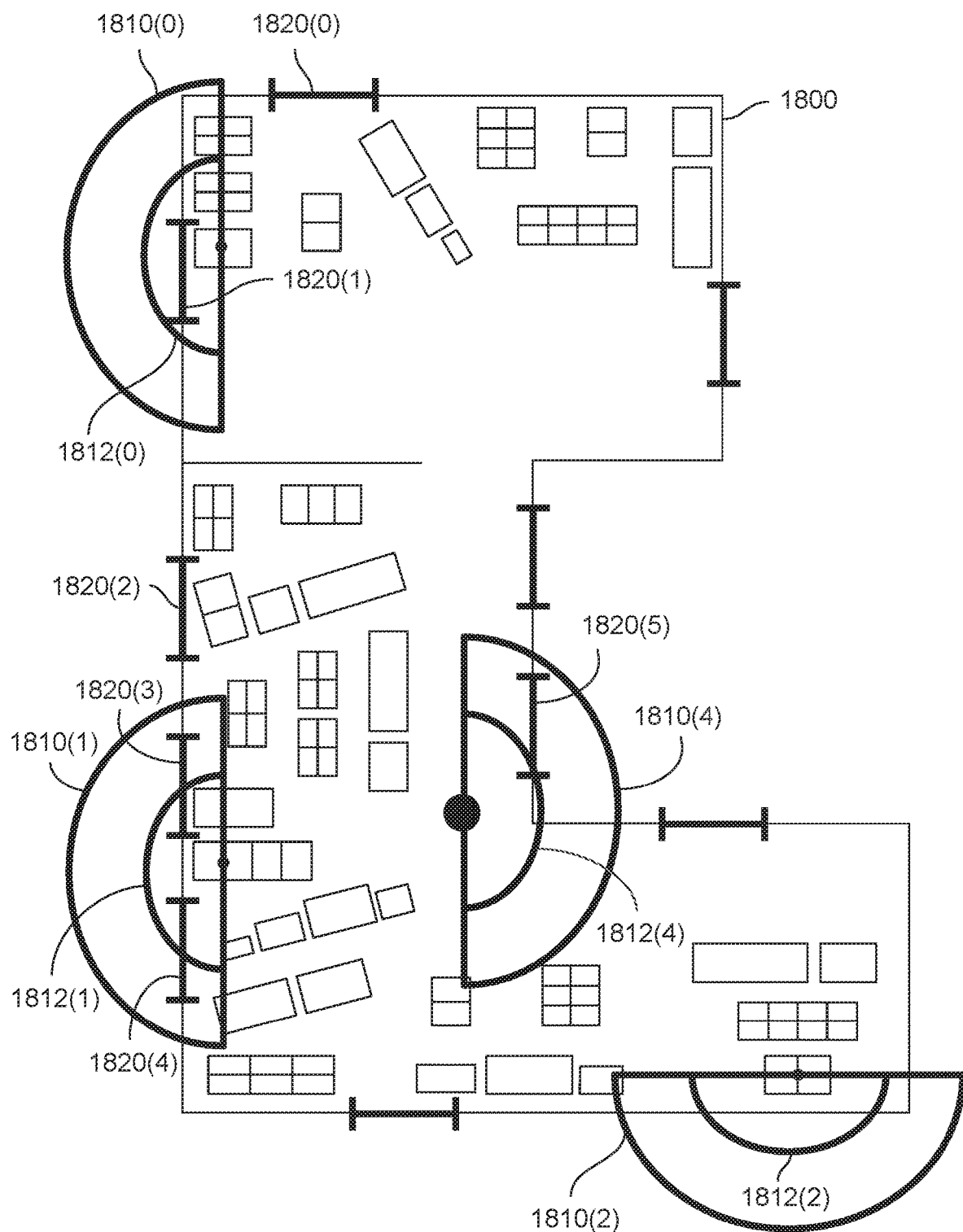
FIG. 18 is a more detailed illustration of the view grid of FIG. 14, according to various embodiments of the present invention.

FIG. 18 is a more detailed illustration of the view grid of FIG. 14, according to various embodiments of the present invention. As shown, an exemplary view grid 1800 includes long range and short range visual zones 1810 and 1812, respectively. Similar to the visual zones discussed above in conjunction with FIG. 17, each long range visual zone 1810 is associated with a short range visual zone 1812 to form a set of visual zones. View analyzer 1440 constructs a different set of visual zones for each desk in design option 214 in order to determine the number of views to outward facing windows 1820 from each desk. View analyzer 1440 also determines the number of views to outward facing windows 1830 from high circulation nodes 1630. View analyzer 1440 then computes, for each potential occupant, the number of views the occupant has from the desk assigned to that occupant, as well as the number of views the occupant has from any high circulation nodes the occupant traverses. View analyzer 1440 then computes view metric 1444 to reflect these values. View analyzer 1440 aggregates the per-occupant view metrics across all occupants and floors of design option 214 to generate an overall view metric for design option 214. View analyzer 214 may then average this metric across all desks to create a per-desk view metric.

Figure 19:
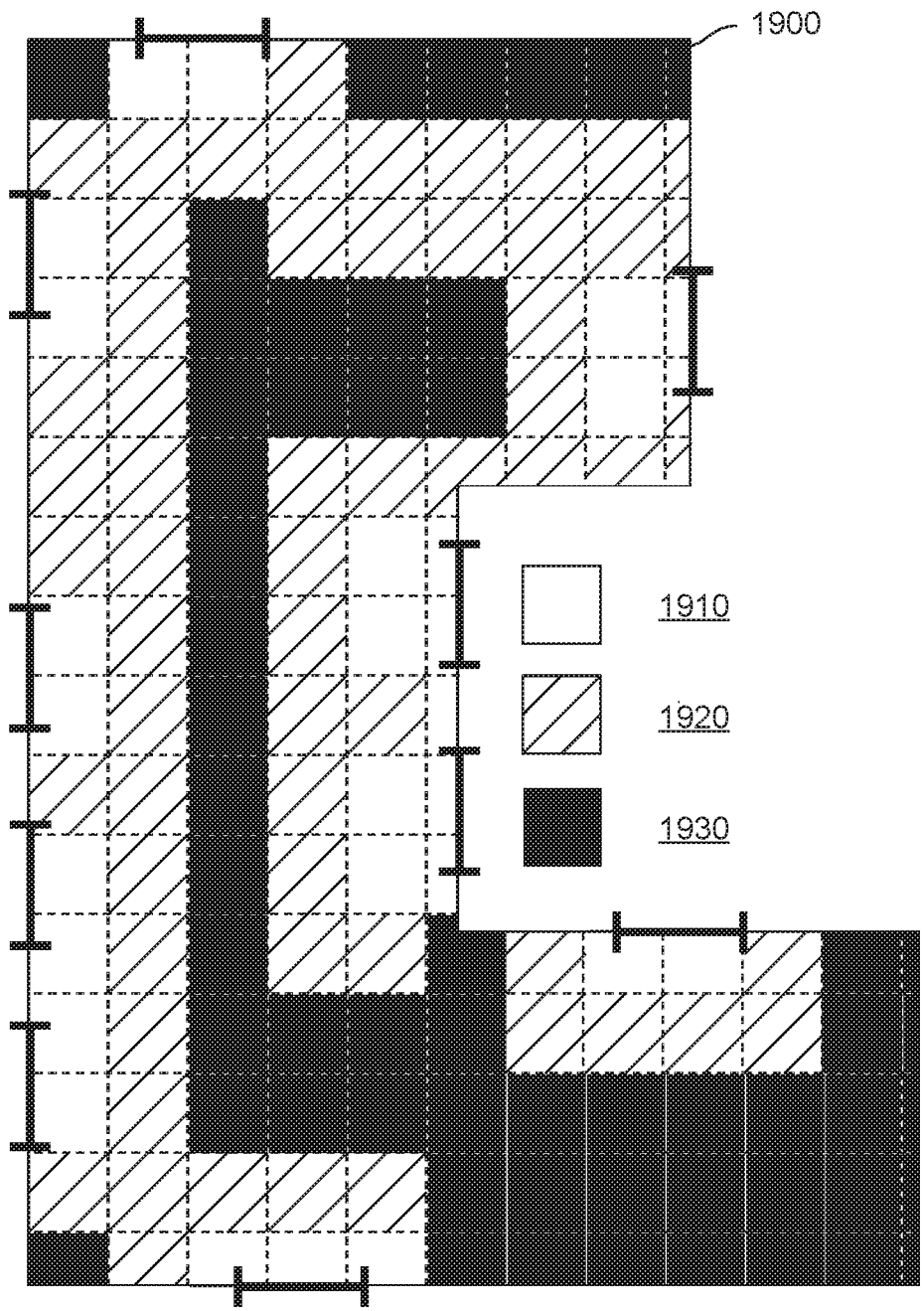
FIG. 19 is a more detailed illustration of the daylight grid of FIG. 14, according to various embodiments of the present invention.

FIG. 19 is a more detailed illustration of the daylight grid of FIG. 14, according to various embodiments of the present invention. As shown, exemplary daylight grid 1900 includes high flux nodes 1910, medium flux nodes 1920, and low flux nodes 1930. High flux nodes 1910 receive the most natural sunlight, averaged across each day of the year. Medium flux nodes 1920 receive a moderate amount of sunlight on average, and low flux nodes 1930 receive the least amount of natural sunlight during the year. Daylight analyzer 1450 generates daylight grid 1900 using a daylight simulator program. Daylight analyzer 1450 may then identify nodes that meet certain recommended criteria, and group these nodes into different categories, such as high flux, medium flux, and low flux, for example. Daylight analyzer 1450 then generates daylight metric 1454 to indicate the overall amount of natural light expected to flow through design option 214 per grid square. Daylight metric 1454 may also indicate the number of grid squares that meet a given daylight flux standard.

Based on daylight grid 1900, and also based on circulation grid 1600 shown in FIG. 16, workstyle analyzer 1460 is configured to generate a separate workstyle metric 1464 for each potential occupant. A given workstyle metric 1464 generated for any particular occupant indicates the degree to which the desk assigned to that occupant provides (i) a preferred amount of natural lighting and (ii) preferred exposure to high circulation nodes and other sources of activity, noise, and/or distractions. These preferences are indicated in criteria 204 per occupant. Workstyle analyzer 1460 aggregates individual workstyle metrics across teams within neighborhoods 802 and across floors in design option 214 to generate an overall workstyle metric 1464. Workstyle analyzer 1460 may also average this global metric based on the number of desks assigned in design option 214.

Referring generally to FIGS. 13-19, the various design analyzers discussed thus far generate the particular metrics set forth above to cooperatively produce metrics 222. Metrics 222 quantify the degree to which the preferences associated with a group of potential occupants are met by each design option 214. The essential operation of metric module 220 and the various design analyzers included therein is discussed below in conjunction with FIGS. 20A-20B.

Figure 20A:
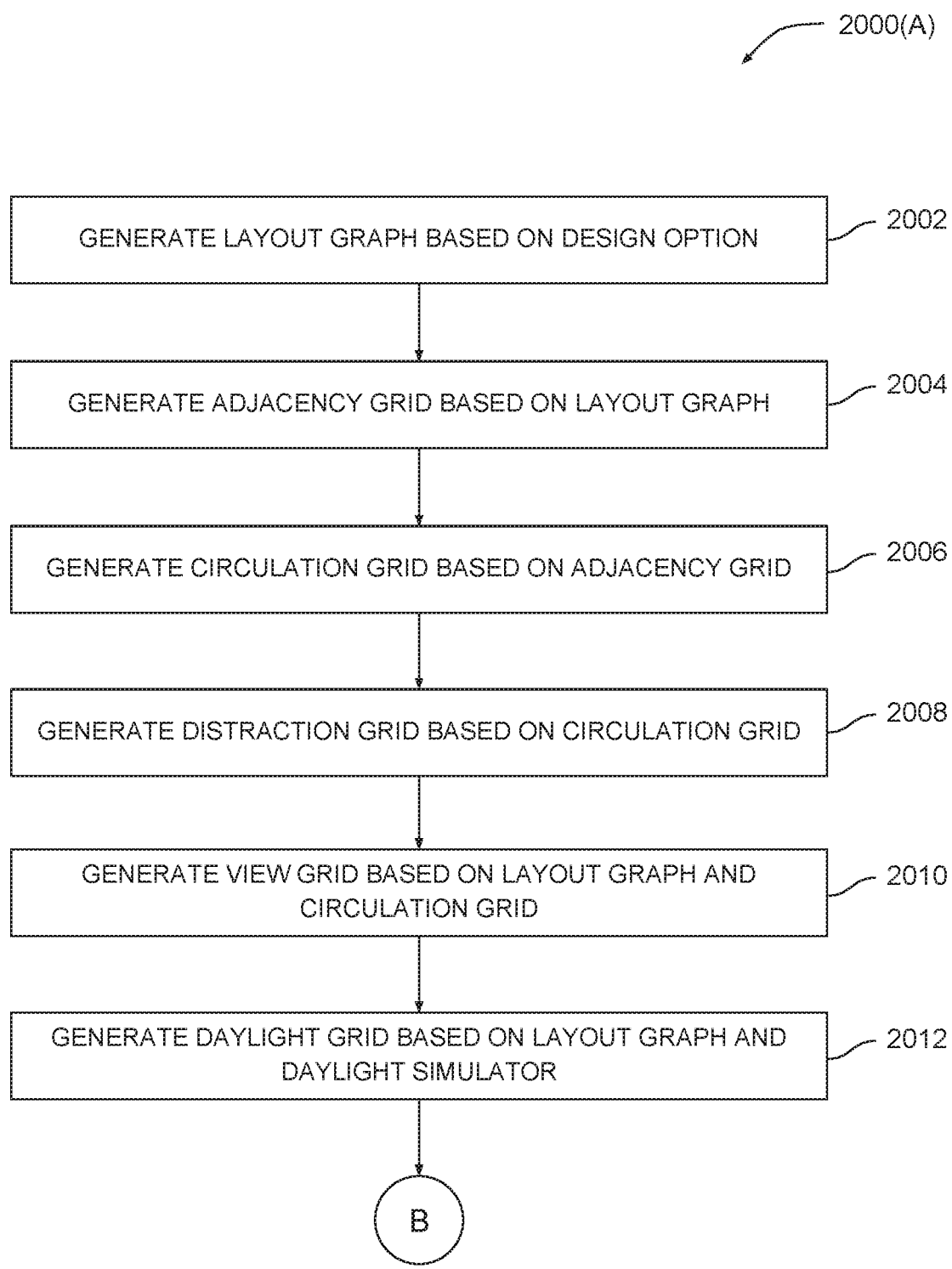
FIGS. 20A-20B set forth a flow diagram of method steps for generating a set of design metrics corresponding to a given design, according to various embodiments of the present invention.
Figure 20B:
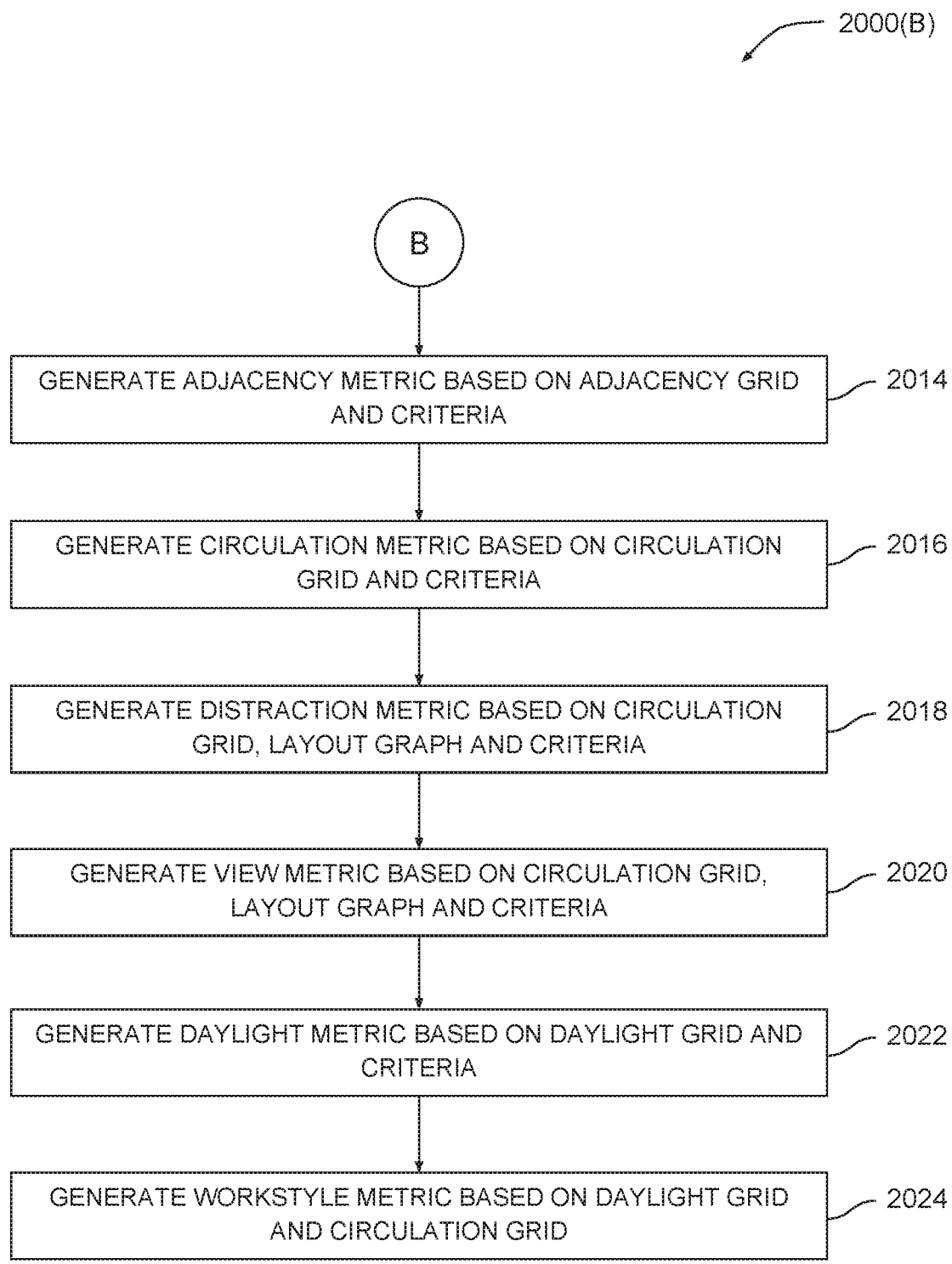

FIGS. 20A-20B set forth a flow diagram of method steps for generating a set of metrics corresponding to a given design, according to various embodiments of the present invention. Although the method steps are described in conjunction with the systems of FIGS. 1-2, 4-11, and 13-19, persons skilled in the art will understand that any system configured to perform the method steps, in any order, is within the scope of the present invention.

As shown in FIG. 20A, a method 2000 begins at step 2002, where graph analyzer 1400 generates layout graph 1310 based on design option 214. Layout graph 1310 includes various nodes and edges representing traversals of design area 510 of design option 214. At step 2004, adjacency analyzer 1410 generates adjacency grid 1412 based on layout graph 1310. Adjacency grid 1500 of FIG. 15 provides one example of an adjacency grid. At step 2006, circulation analyzer 1420 generates circulation grid 1422 based on adjacency grid 1412. Circulation grid 1600 of FIG. 16 provides one example of a circulation grid. At step 2008, distraction analyzer 1430 generates distraction grid 1432 based on circulation grid 1422. Distraction grid 1700 of FIG. 17 provides one example of a distraction grid. At step 2010, view analyzer 1440 generates view grid 1442 based on layout graph 1310 and circulation grid 1422. View grid 1800 of FIG. 18 provides one example of a view grid. At step 2012, daylight analyzer 1450 generates daylight grid 1452 based on layout graph 1310 and a daylight simulator. Daylight grid 1900 of FIG. 19 provides one example of a daylight grid. The method then proceeds in FIG. 20B.

As shown in FIG. 20B, at step 2014, adjacency analyzer 1410 generates adjacency metric 1414 based on adjacency grid 1412 and criteria 204. Adjacency metric 1414 represents the average proximity to locations of interest for each potential occupant. At step 2016, circulation analyzer 1420 generates circulation metric 1424 based on circulation grid 1422 and criteria 204. Circulation metric 1424 represents an estimated amount of traffic across each grid location within design option 214. At step 2018, distraction analyzer 1430 generates a distraction metric 1434 based on circulation grid 1422, layout graph 1310 and criteria 204. Distraction metric 1434 indicates the number of distractions a potential occupant may be exposed to on a day to day basis. At step 2020, view analyzer 1440 generates view metric 1444 based on circulation grid 1422, layout graph 1310, and criteria 204. View metric 1444 reflects the number of outside views to which a potential occupant may be exposed on a regular basis. At step 2022, daylight analyzer 1450 generates daylight metric 1454 based on daylight grid 1452 and criteria 204. Daylight metric 1454 indicates the fraction of desired daylight a given potential occupant is estimated to receive over a time period. At step 2024, workstyle analyzer 1460 generates workstyle metric 1464 based on daylight grid 1452 and circulation grid 1422. Workstyle metric 1464 represents the amount of daylight and the amount of distractions a given potential occupant is expected to experience.

Metric module 220 implements the method 2000 iteratively across all design options 214 to generate a different set of metrics 222 for each such design option. Metric module 220 may implement each step of the method 2000 in parallel for improved computational throughput. Metric module 220 may also combine the metrics for any given design option 214 into a single metric indicating how closely the design option 214 meets criteria 204. Metric module 220 may also display the metrics for any given design option 214 separately in a format such as a radial graph. These approaches provide a quantifiable means to rate each design option, allowing those options to be readily analyzed by interested parties. In addition, these metrics provide objective functions that can be optimized via the generative design process performed by geometry engine 210.

In sum, a design engine includes a geometry module and a metric module that interoperate to generate optimal design options. The geometry module initially generates a spectrum of design options for a structure based on project constraints and design criteria set forth by potential occupants of the structure. The metric module then analyzes each design option and generates, for any given design option, a set of metrics that indicates how well the given design option meets the design criteria. The geometry module then generates additional design options in an evolutionary manner to improve the metrics generated for subsequent design options.

An advantage of the techniques set forth above is that the design options generated via the design engine specifically address the numerous competing design objectives typically associated with architectural design projects. This approach shifts responsibility for managing these objectives away from human designers. In addition, the various metrics generated by the design engine quantify the degree to which each design objective is met, thereby reducing the role of human intuition in analyzing design options. These metrics further allow the design engine to iteratively generate improved design options that better meet the design objectives.

Importantly, by computing the aforesaid metrics, the design engine generates hard data according to which stakeholders in architectural design projects can select between design options in an objective manner. Conventional architectural design applications lack the capacity to compute such metrics, and therefore cannot generate hard data comparable to that generated by the design engine. Accordingly, the techniques for computing these metrics constitute a significant improvement to conventional architectural design applications, and therefore represent a technical solution to a technical problem existing in prior art design applications.

1. In some embodiments, a computer-implemented method for generating a set of design options for a structure includes: generating initial geometry for a first design option based on one or more design constraints, dividing the initial geometry along at least one axis to generate a set of divisions, subdividing the initial geometry based on the set of divisions to generate a plurality of subdivisions, modifying a first subdivision included in the plurality of subdivisions based on one or more construction parameters to generate a first neighborhood, wherein the one or more construction parameters indicate at least one of a shape, size, and position for the first neighborhood, generating a first set of fixtures associated with the structure, and populating the first neighborhood with the first set of fixtures to produce at least a portion of the first design option.

2. The computer-implemented method of clause 1, wherein dividing the initial geometry comprises: identifying one or more generative regions included in the initial geometry that are separate from one or more non-generative regions included in the initial geometry, and generating a first centerline that divides a first generative region included in the one or more generative regions along the at least one axis.

3. The computer-implemented method of any of clauses 1 and 2, wherein subdividing the initial geometry comprises: generating a sequence of seed points along the first centerline, generating a sequence of boundaries along the first centerline, wherein each boundary in the sequence of boundaries separates one seed point in the sequence of seed points from an adjacent seed point in the sequence of seed points, shifting each seed point in the sequence of seed points away from the centerline to generate a set of center points, and adjusting each boundary in the sequence of boundaries relative to the set of centerpoints to generate a set of adjusted boundaries, wherein each subdivision included in the plurality of subdivisions is defined by one or more adjusted boundaries.

4. The computer-implemented method of any of clauses 1, 2, and 3, further comprising populating the first neighborhood with the first set of fixtures by: selecting a boundary of the first subdivision, generating an amenity zone adjacent to the boundary, and selecting an amenity for placement in the amenity zone.

5. The computer-implemented method of any of clauses 1, 2, 3, and 4, further comprising generating a computer-based survey to determine, for each potential occupant included in a group of potential occupants, a desired proximity to one or more amenities, a desired exposure to traffic associated with other potential occupants, a desired proximity to working areas associated with other potential occupants, a desired number of visible windows, and a desired amount of daylight.

6. The computer-implemented method of any of clauses 1, 2, 3, 4, and 5, further comprising: parsing results from the computer-based survey to generate a set of design criteria, and assigning a first subgroup of potential occupants included in the group of potential occupants to the first neighborhood based on a first subset of the design criteria that is associated with the first subgroup of potential occupants.

7. The computer-implemented method of any of clauses 1, 2, 3, 4, 5, and 6, wherein assigning the first subgroup of potential occupants to the first neighborhood comprises: generating a first metric indicating a degree to which the first neighborhood meets the first subset of the design criteria, and determining that the first metric is greater than a second metric indicating a degree to which a second neighborhood meets the first subset of the design criteria.

8. The computer-implemented method of any of clauses 1, 2, 3, 4, 5, 6, and 7, further comprising generating a spectrum of varied design options by iteratively: modifying the construction parameters to generate modified construction parameters, separating the initial geometry into alternative subdivisions based on the modified construction parameters, generating a set of neighborhoods based on the alternative subdivisions, distributing a group of potential occupants across the set of neighborhoods based on a set of design criteria to generate a given design option, wherein the set of design criteria indicates one or more preferences associated with the group of potential occupants.

9. The computer-implemented method of any of clauses 1, 2, 3, 4, 5, 6, 7, and 8, wherein each of the one or more design constraints indicates a geometrical restriction placed on the first design option.

10. The computer-implemented method of any of clauses 1, 2, 3, 4, 5, 6, 7, 8, and 9, wherein each one of the plurality of subdivisions corresponds to a different group of potential occupants.

11. In some embodiments, a non-transitory computer-readable medium stores program instructions that, when executed by a processor, cause the processor to generate a set of design options for a structure, by performing the steps of: generating initial geometry for a first design option based on one or more design constraints, dividing the initial geometry along at least one axis to generate a set of divisions, subdividing the initial geometry based on the set of divisions to generate a plurality of subdivisions, modifying a first subdivision included in the plurality of subdivisions based on one or more construction parameters to generate a first neighborhood, wherein the one or more construction parameters indicate at least one of a shape, size, and position for the first neighborhood, generating a first set of fixtures associated with the structure, and populating the first neighborhood with the first set of fixtures to produce at least a portion of the first design option.

12. The non-transitory computer-readable medium of clause 11, wherein the step of dividing the initial geometry comprises: identifying one or more generative regions included in the initial geometry that are separate from one or more non-generative regions included in the initial geometry, and generating a first centerline that divides a first generative region included in the one or more generative regions along the at least one axis.

13. The non-transitory computer-readable medium of any of clauses 11 and 12, wherein the step of subdividing the initial geometry comprises: generating a sequence of seed points along the first centerline, generating a sequence of boundaries along the first centerline, wherein each boundary in the sequence of boundaries separates one seed point in the sequence of seed points from an adjacent seed point in the sequence of seed points, shifting each seed point in the sequence of seed points away from the centerline to generate a set of center points, and adjusting each boundary in the sequence of boundaries relative to the set of centerpoints to generate a set of adjusted boundaries, wherein each subdivision included in the plurality of subdivisions is defined by one or more adjusted boundaries.

14. The non-transitory computer-readable medium of any of clauses 11, 12, and 13, further comprising the step of populating the first neighborhood with the first set of fixtures by: selecting a boundary of the first subdivision, generating an amenity zone adjacent to the boundary, and selecting an amenity for placement in the amenity zone.

15. The non-transitory computer-readable medium of any of clauses 11, 12, 13, and 14, further comprising the step of generating a computer-based survey to determine, for each potential occupant included in a group of potential occupants, a desired proximity to one or more amenities, a desired exposure to traffic associated with other potential occupants, a desired proximity to working areas associated with other potential occupants, a desired number of visible windows, and a desired amount of daylight.

16. The non-transitory computer-readable medium of any of clauses 11, 12, 13, 14, and 15, further comprising: parsing results from the computer-based survey to generate a set of design criteria, and assigning a first subgroup of potential occupants included in the group of potential occupants to the first neighborhood based on a first subset of the design criteria that is associated with the first subgroup of potential occupants.

17. The non-transitory computer-readable medium of any of clauses 11, 12, 13, 14, 15, and 16, wherein assigning the first subgroup of potential occupants to the first neighborhood comprises: generating a first metric indicating a degree to which the first neighborhood meets the first subset of the design criteria, and determining that the first metric is greater than a second metric indicating a degree to which a second neighborhood meets the first subset of the design criteria.

18. The non-transitory computer-readable medium of any of clauses 11, 12, 13, 14, 15, 16, and 17, further comprising the step of generating a spectrum of varied design options by iteratively: generating varied geometry by modifying a previous design option, separating the varied geometry into alternative subdivisions based on modified construction parameters, generating one or more neighborhoods based on the alternative subdivisions, and distributing a group of potential occupants across the one or more neighborhoods based on a set of design criteria to generate a given design option.

19. The non-transitory computer-readable medium of any of clauses 11, 12, 13, 14, 15, 16, 17, and 18, wherein each of the one or more design constraints indicates a geometrical restriction placed on the first design option, and wherein each one of the plurality of subdivisions corresponds to a different group of potential occupants.

20. Some embodiments of the invention include a system for generating a set of design options for a structure, including: a memory that stores a design engine; and a processor that is coupled to the memory and, when executing the design engine, is configured to perform the steps of: generating initial geometry for a first design option based on one or more design constraints, dividing the initial geometry along at least one axis to generate a set of divisions, subdividing the initial geometry based on the set of divisions to generate a plurality of subdivisions, modifying a first subdivision included in the plurality of subdivisions based on one or more construction parameters to generate a first neighborhood, wherein the one or more construction parameters indicate at least one of a shape, size, and position for the first neighborhood, generating a first set of fixtures associated with the structure, and populating the first neighborhood with the first set of fixtures to produce at least a portion of the first design option.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method for generating a set of design options for a structure, the method comprising:
    generating initial geometry for a first design option based on one or more design constraints, wherein the first design option comprises a computer-aided design and delineates the initial geometry;
    dividing the initial geometry along at least one axis to generate a set of divisions;
    generating a sequence of seed points along the at least one axis based on one or more distribution parameters indicating number and proximity of adjacent seed points in the sequence of seed points;
    generating a sequence of boundaries along the at least one axis based on the sequence of seed points and the one or more distribution parameters, wherein each boundary in the sequence of boundaries separates one seed point in the sequence of seed points from an adjacent seed point in the sequence of seed points;
    subdividing the initial geometry based on the set of divisions to generate a plurality of subdivisions;
    modifying a first subdivision included in the plurality of subdivisions based on one or more construction parameters for the first design option to generate a first neighborhood, wherein the one or more construction parameters indicate at least one of a shape, size, or position for the first neighborhood; and
    displaying, for analysis by a user, at least a portion of the first design option and one or more objective functions, wherein the first design option is based on the first neighborhood and one or more of the one or more construction parameters for the first design option, and wherein the one or more objective functions enable the user to rate the first design option against the one or more design constraints.

2. The computer-implemented method of claim 1, wherein dividing the initial geometry comprises:
    identifying one or more generative regions included in the initial geometry that are separate from one or more non-generative regions included in the initial geometry; and
    generating a first centerline that divides a first generative region included in the one or more generative regions along the at least one axis.

3. The computer-implemented method of claim 1, wherein subdividing the initial geometry comprises:
    adjusting each boundary in the sequence of boundaries relative to the sequence of seed points to generate a set of adjusted boundaries, wherein each subdivision included in the plurality of subdivisions is defined by one or more adjusted boundaries.

4. The computer-implemented method of claim 1, further comprising populating the first neighborhood with a first set of fixtures by:
    selecting a boundary of the first subdivision;
    generating an amenity zone adjacent to the boundary; and
    selecting an amenity for placement in the amenity zone.

5. The computer-implemented method of claim 1, further comprising generating a computer-based survey to determine, for each potential occupant included in a group of potential occupants, a desired proximity to one or more amenities, a desired exposure to traffic associated with other potential occupants, a desired proximity to working areas associated with other potential occupants, a desired number of visible windows, and a desired amount of daylight.

6. The computer-implemented method of claim 5, further comprising:
    generating a set of design criteria in response to results from the computer-based survey; and
    assigning a first subgroup of potential occupants included in the group of potential occupants to the first neighborhood based on a first subset of the design criteria that is associated with the first subgroup of potential occupants.

7. The computer-implemented method of claim 6, wherein assigning the first subgroup of potential occupants to the first neighborhood comprises:
    generating a first metric indicating a degree to which the first neighborhood meets the first subset of the design criteria; and
    determining that the first metric is greater than a second metric indicating a degree to which a second neighborhood meets the first subset of the design criteria.

8. The computer-implemented method of claim 1, further comprising generating a spectrum of varied design options by iteratively:
    modifying the construction parameters to generate modified construction parameters;
    separating the initial geometry into alternative subdivisions based on the modified construction parameters;
    generating a set of neighborhoods based on the alternative subdivisions; and
    distributing a group of potential occupants across the set of neighborhoods based on a set of design criteria to generate a given design option, wherein the set of design criteria indicates one or more preferences associated with the group of potential occupants.

9. The computer-implemented method of claim 1, wherein each of the one or more design constraints indicates a geometrical restriction placed on the first design option.

10. The computer-implemented method of claim 1, wherein each one of the plurality of subdivisions corresponds to a different group of potential occupants.

11. A non-transitory computer-readable medium storing program instructions that, when executed by a processor, causes the processor to generate a set of design options for a structure, by performing the steps of:

generating initial geometry for a first design option, wherein the first design option comprises a computer-aided design and is based on one or more design constraints;

dividing the initial geometry along at least one axis to generate a set of divisions;

generating a sequence of seed points along the at least one axis based on one or more distribution parameters indicating number and proximity of adjacent seed points in the sequence of seed points;

generating a sequence of boundaries along the at least one axis based on the sequence of seed points and the one or more distribution parameters, wherein each boundary in the sequence of boundaries separates one seed point in the sequence of seed points from an adjacent seed point in the sequence of seed points;

subdividing the initial geometry based on the set of divisions to generate a plurality of subdivisions;

modifying a first subdivision included in the plurality of subdivisions based on one or more construction parameters for the first design option to generate a first neighborhood, wherein the one or more construction parameters indicate at least one of a shape, size, or position for the first neighborhood; and displaying, for analysis by a user, at least a portion of the first design option and one or more objective functions, wherein the first design option is based on the first neighborhood and one or more of the one or more construction parameters for the first design option, and wherein the one or more objective functions enable the user to rate the first design option against the one or more design constraints.

12. The non-transitory computer-readable medium of claim 11, wherein the step of dividing the initial geometry comprises:

identifying one or more generative regions included in the initial geometry that are separate from one or more non-generative regions included in the initial geometry; and generating a first centerline that divides a first generative region included in the one or more generative regions along the at least one axis.

13. The non-transitory computer-readable medium of claim 11, wherein the step of subdividing the initial geometry comprises:

adjusting each boundary in the sequence of boundaries relative to the sequence of seed points to generate a set of adjusted boundaries, wherein each subdivision included in the plurality of subdivisions is defined by one or more adjusted boundaries.

14. The non-transitory computer-readable medium of claim 11, further comprising the step of populating the first neighborhood with a first set of fixtures by:

selecting a boundary of the first subdivision;
generating an amenity zone adjacent to the boundary; and
selecting an amenity for placement in the amenity zone.

15. The non-transitory computer-readable medium of claim 11, further comprising the step of generating a computer-based survey to determine, for each potential occupant included in a group of potential occupants, a desired proximity to one or more amenities, a desired exposure to traffic associated with other potential occupants, a desired proximity to working areas associated with other potential occupants, a desired number of visible windows, and a desired amount of daylight.

16. The non-transitory computer-readable medium of claim 15, further comprising:

generating a set of design criteria in response to results from the computer-based survey; and assigning a first subgroup of potential occupants included in the group of potential occupants to the first neighborhood based on a first subset of the design criteria that is associated with the first subgroup of potential occupants.

17. The non-transitory computer-readable medium of claim 16, wherein assigning the first subgroup of potential occupants to the first neighborhood comprises:

generating a first metric indicating a degree to which the first neighborhood meets the first subset of the design criteria; and determining that the first metric is greater than a second metric indicating a degree to which a second neighborhood meets the first subset of the design criteria.

18. The non-transitory computer-readable medium of claim 11, further comprising the step of generating a spectrum of varied design options by iteratively:

generating varied geometry by modifying a previous design option;

separating the varied geometry into alternative subdivisions based on modified construction parameters;

generating one or more neighborhoods based on the alternative subdivisions; and distributing a group of potential occupants across the one or more neighborhoods based on a set of design criteria to generate a given design option.

19. The non-transitory computer-readable medium of claim 11, wherein each of the one or more design constraints indicates a geometrical restriction placed on the first design option, and wherein each one of the plurality of subdivisions corresponds to a different group of potential occupants.

20. A system for generating a set of design options for a structure, including:

a memory that stores a design engine; and
a processor that is coupled to the memory and, when executing the design engine, is configured to perform the steps of:

generating initial geometry for a first design option, wherein the first design option comprises a computer-aided design and is based on one or more design constraints, dividing the initial geometry along at least one axis to generate a set of divisions, generating a sequence of seed points along the at least one axis based on one or more distribution parameters indicating number and proximity of adjacent seed points in the sequence of seed points, generating a sequence of boundaries along the at least one axis based on the sequence of seed points and the one or more distribution parameters, wherein each boundary in the sequence of boundaries separates one seed point in the sequence of seed points from an adjacent seed point in the sequence of seed points, subdividing the initial geometry based on the set of divisions to generate a plurality of subdivisions, modifying a first subdivision included in the plurality of subdivisions based on one or more construction parameters for the first design option to generate a first neighborhood, wherein the one or more construction parameters indicate at least one of a shape, size, or position for the first neighborhood, and displaying, for analysis by a user, at least a portion of the first design option and one or more objective functions, wherein the first design option is based on the first neighborhood and one or more of the one or more construction parameters for the first design option, and wherein the one or more objective functions enable the user to rate the first design option against the one or more design constraints.

* * * * *